US012385958B2

(12) United States Patent
Sasai et al.

(10) Patent No.: US 12,385,958 B2
(45) Date of Patent: Aug. 12, 2025

(54) CAPACITANCE DETECTION DEVICE, CAPACITANCE DETECTION METHOD, AND INPUT DEVICE

(71) Applicant: Alps Alpine Co., Ltd., Tokyo (JP)

(72) Inventors: Kiyoshi Sasai, Miyagi-ken (JP); Akihisa Iikura, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 250 days.

(21) Appl. No.: 18/364,226

(22) Filed: Aug. 2, 2023

(65) Prior Publication Data

US 2023/0408565 A1 Dec. 21, 2023

Related U.S. Application Data

(63) Continuation of application No. PCT/JP2021/044856, filed on Dec. 7, 2021.

(30) Foreign Application Priority Data

Feb. 4, 2021 (JP) ................................. 2021-016949

(51) Int. Cl.
*G01R 27/26* (2006.01)
*G01D 5/24* (2006.01)
(Continued)

(52) U.S. Cl.
CPC ....... *G01R 27/2605* (2013.01); *G01R 35/005* (2013.01); *G01D 5/24* (2013.01); *H03K 17/955* (2013.01)

(58) Field of Classification Search
CPC ........ G01R 27/00; G01R 27/02; G01R 27/26; G01R 27/2605; G01R 35/00;
(Continued)

(56) References Cited

U.S. PATENT DOCUMENTS 10,942,613 B2 * 3/2021 Fujiyoshi .............. G06F 3/0446
12,019,109 B2 * 6/2024 Fujiyoshi ........... G01R 27/2605
(Continued)

FOREIGN PATENT DOCUMENTS

| JP | 7170150 B2 * | 11/2022 | ............ G01R 19/04 |
| KR | 20220061222 A * | 5/2022 | ............ G01R 27/26 |
| WO | WO-2018116706 A1 * | 6/2018 | ............ G01R 27/26 |

OTHER PUBLICATIONS

International Search Report from International Application No. PCT/JP2021/044856 dated Jan. 25, 2022.

*Primary Examiner* — Hoai-An D. Nguyen
(74) *Attorney, Agent, or Firm* — Beyer Law Group LLP

(57) ABSTRACT

A calculation unit calculates a detection value of a capacitance of a capacitor based on a detection signal. A correction unit repeatedly performs a shift to a correction mode. When the correction mode is entered, the correction unit controls an AC voltage output unit so that a difference between amplitudes of first and second AC voltages changes, and obtains a correction value corresponding to a change in the detection value of the calculation unit caused by the change in the difference between the amplitudes. The correction unit corrects the detection value calculated by the calculation unit in accordance with the change in the correction values obtained in the correction mode.

15 Claims, 16 Drawing Sheets

(51) Int. Cl.
    *G01R 35/00*     (2006.01)
    *H03K 17/955*     (2006.01)

(58) Field of Classification Search
    CPC ...... G01R 35/005; H03K 17/00; H03K 17/94;
            H03K 17/945; H03K 17/955; G01D 5/00;
               G01D 5/12; G01D 5/14; G01D 5/24
    USPC ........................................ 324/600, 649, 658
    See application file for complete search history.

(56) References Cited

U.S. PATENT DOCUMENTS

| | | |
|---|---|---|
| 2013/0207677 A1 | 8/2013 | Togura et al. |
| 2016/0117017 A1 | 4/2016 | Kremin et al. |
| 2019/0294297 A1 | 9/2019 | Sasai et al. |

\* cited by examiner

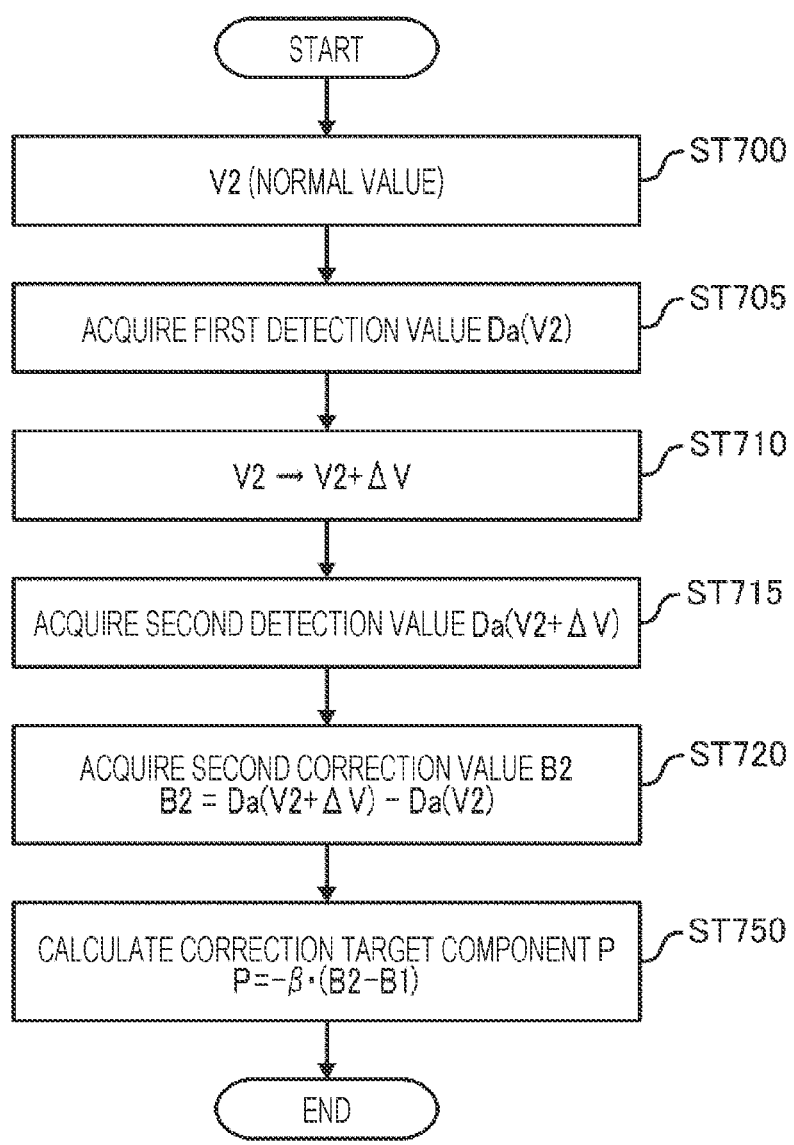

CAPACITANCE DETECTION DEVICE, CAPACITANCE DETECTION METHOD, AND INPUT DEVICE

CLAIM OF PRIORITY

This application is a Continuation of International Application No. PCT/JP2021/044856 filed on Dec. 7, 2021, which claims benefit of Japanese Patent Application No. 2021-016949 filed on Feb. 4, 2021. The entire contents of each application noted above are hereby incorporated by reference.

BACKGROUND OF THE INVENTION

1. Field of the Invention

The present disclosure relates to a capacitance detection device, a capacitance detection method, and a capacitive type input device.

2. Description of the Related Art

In a self-capacitance type capacitance detection device that detects a capacitance of a detection electrode relative to the ground, a parasitic capacitor generated between the ground and the detection electrode causes a problem in that detection sensitivity and accuracy is degraded. In general, a shield electrode (also referred to as an active shield) driven to have the same potential as the detection electrode may be disposed close to the detection electrode to reduce an effect of such a parasitic capacitor. The shield electrode reduces a capacitance of the parasitic capacitor because the detection electrode is less likely to form an electrostatic coupling with surrounding conductors. Since the shield electrode is at the same potential as the detection electrode, a capacitance between the active shield and the detection electrode does not affect a detection result.

On the other hand, in a capacitance detection device disclosed in International Publication No. 2018/116706 below, an amplitude of an AC voltage driving a detection electrode is adjusted to be smaller than an AC voltage of a shield electrode. In other words, an amplitude of the AC voltage at the shield electrode is adjusted so that a charge supplied to a parasitic capacitor positioned between the detection electrode and the ground is canceled by a charge supplied to a capacitor positioned between the detection electrode and the shield electrode. Accordingly, an adverse effect of the parasitic capacitor between the detection electrode and the ground on detection sensitivity and detection accuracy may be further reduced.

Here, in the capacitance detection device described in International Publication No. 2018/116706, since a charge is supplied to the capacitor between the detection electrode and the shield electrode by a voltage difference between the detection electrode and the shield electrode, when a capacitance value of the capacitor between the detection electrode and the shield electrode changes, an error occurs in a result of a detection of the capacitance between the detection electrode and the shield electrode. The capacitance of the capacitor between the detection electrode and the shield electrode is larger than the capacitance between the detection electrode and the ground, which is a detection target, and may have temperature dependence due to temperature characteristics of a dielectric constant of a circuit board on which the shield electrode is formed, etc. Therefore, there arises a problem in that, when the capacitance of the capacitor between the detection electrode and the shield electrode changes due to temperature or other factors, an error occurs in a detection result.

SUMMARY OF THE INVENTION

The present invention provides a capacitance detection device and a capacitance detection method of the capacitance detection device that may reduce an error in a detection result caused by a change in a capacitance of a capacitor formed between a detection electrode and a shield electrode, and an input device including the capacitance detection device.

According to an aspect of the present disclosure, a capacitance detection device detects a capacitance between an object that approaches a detection electrode and the detection electrode. The capacitance detection device includes an AC voltage output unit that outputs a first AC voltage to be supplied to a shield electrode disposed close to the detection electrode and a second AC voltage that has a frequency and a phase equivalent to those of the first AC voltage and that has an amplitude smaller than that of the first AC voltage, a detection signal generation unit that supplies a charge to the detection electrode from a node so that a voltage of the node connected to the detection electrode approaches the second AC voltage and generates an AC detection signal in accordance with the supplied charge, a calculation unit that calculates a detection value of the capacitance based on the detection signal, and a correction unit that corrects a change in the detection value caused by a change in a shield capacitance that is a parasitic capacitance between the shield electrode and the detection electrode. When a shift to the correction mode is repeatedly performed and the correction mode is entered, the correction unit controls the AC voltage output unit so that a difference between amplitudes of the first and second AC voltages is changed, obtains a correction value corresponding to a change in the detection value caused by a change in the difference between the amplitudes, and corrects the detection value in accordance with a change in the correction value obtained in the correction mode.

BRIEF DESCRIPTION OF THE DRAWINGS

FIG. 15 is a flowchart of an example of a process in the correction mode after the initial state in the capacitance detection method of FIG. 13.

DESCRIPTION OF THE PREFERRED EMBODIMENTS

Overview

Figure 1:
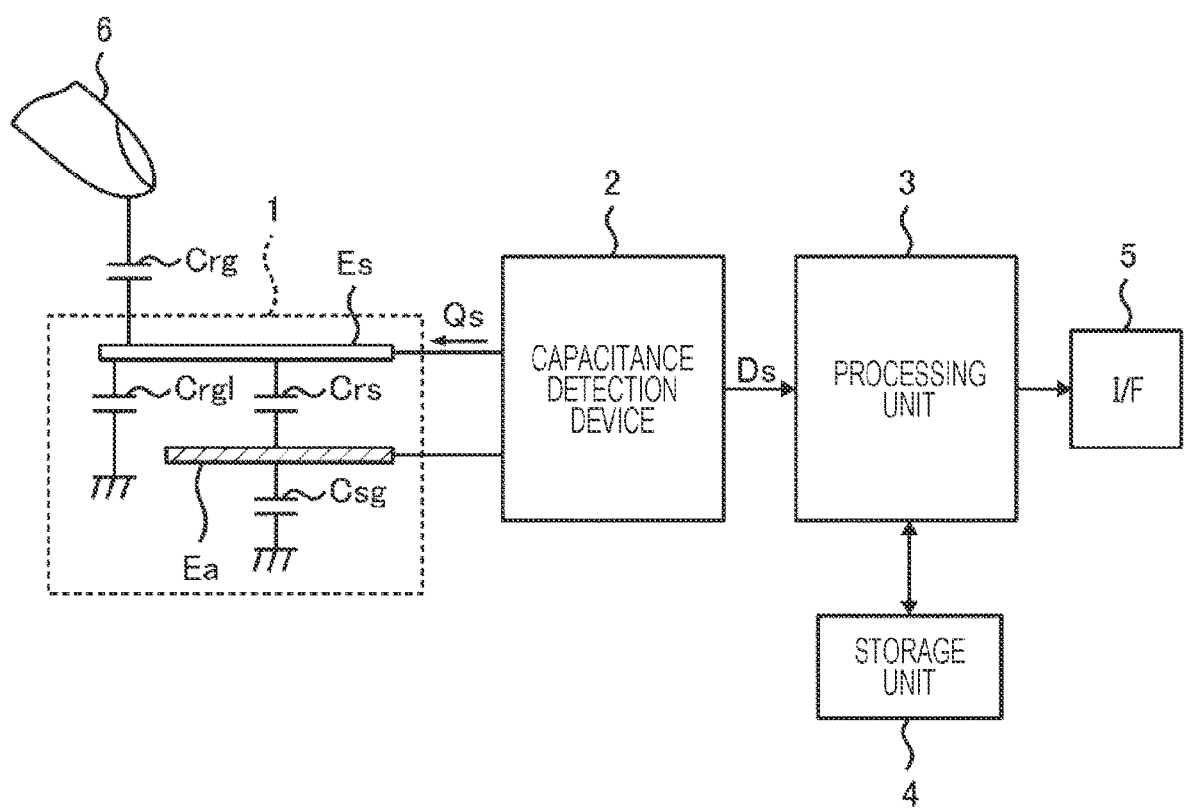
FIG. 1 is a diagram illustrating an example of a configuration of an input device according to an embodiment.

First, an overview of a capacitance detection device, a capacitance detection method, and an input device according to the present disclosure will be described.

A first aspect of the present disclosure relates to a capacitance detection device that detects a capacitance between an object positioned proximate to a detection electrode and the detection electrode. The capacitance detection device includes an AC voltage output unit that outputs a first AC voltage to be supplied to a shield electrode disposed close to the detection electrode and a second AC voltage that has a frequency and a phase equivalent to those of the first AC voltage and that has an amplitude smaller than that of the first AC voltage, a detection signal generation unit that supplies a charge to the detection electrode from a node so that a voltage of the node connected to the detection electrode approaches the second AC voltage and generates an AC detection signal in accordance with the supplied charge, a calculation unit that calculates a detection value of the capacitance based on the detection signal, and a correction unit that corrects a change in the detection value in accordance with a change in the shield capacitance that is a parasitic capacitance between the shield electrode and the detection electrode. When a shift to the correction mode is repeatedly performed and the correction mode is entered, the correction unit controls the AC voltage output unit so that a difference between amplitudes of the first and second AC voltages changes, obtains a correction value corresponding to a change in the detection value caused by a change in the difference between the amplitudes, and corrects the detection value in accordance with a change in the correction value obtained in the correction mode.

In the capacitance detection device according to the first aspect, a voltage corresponding to a difference between the first AC voltage and the second AC voltage is applied to a parasitic capacitor formed between the detection electrode and the shield electrode (hereinafter referred to as "a capacitor between the detection electrode and the shield electrode" where appropriate), and a charge corresponding to this voltage is supplied from the detection signal generation unit to the capacitor between the detection electrode and the shield electrode. When the shield capacitance, which is the capacitance of the capacitor between the detection electrode and the shield electrode, changes due to temperature or other factors, the charge supplied from the detection signal generation unit to the capacitor between the detection electrode and the shield electrode changes, and accordingly, the detection signal changes. This causes an error in a detection value of a capacitance calculated based on the detection signal.

Therefore, the correction unit performs a process of correcting the change in the detection value caused by the change in the shield capacitance. Specifically, when a shift to the correction mode is repeatedly performed, and the correction mode is entered, the AC voltage output unit is controlled so that the difference between amplitudes of the first AC voltage and the second AC voltage (referred to as an "AC voltage amplitude difference" where appropriate) changes, and in addition, a correction value is obtained in accordance with the change in the detection value caused by the change in the AC voltage amplitude difference. Since the change in the detection value due to the change in the AC voltage amplitude difference has a value corresponding to the shield capacitance, the correction value obtained in the correction mode has a value corresponding to the shield capacitance. The detection value is corrected according to the change in the correction value, and accordingly, the detection value is corrected according to the change in the shield capacitance and a change in the detection value caused by the change in the shield capacitance is corrected. Therefore, an error in the detection value in accordance with the change in the shield capacitance due to temperature and other factors is reduced.

The correction unit may correct the detection value so that a correction target component that is proportional to a difference between a first correction value which is the correction value obtained in the correction mode in the initial state and a second correction value which is the correction value obtained in the correction mode after the initial state and that corresponds to a change in the detection value caused by a change in the shield capacitance is canceled out.

According to this configuration, the correction target component, which is proportional to the difference between the first correction value obtained in the correction mode in the initial state and the second correction value obtained in the correction mode after the initial state, has a value corresponding to the change in the detection value due to the change in the shield capacitance. The detection value is corrected so that the correction target component is canceled out.

By this, the change in the detection value caused by the change in the shield capacitance from the initial state is corrected.

The correction unit may calculate the correction target component each time the correction mode is entered, and in a normal operation mode, correct the detection value based on the correction target component calculated in the most recent correction mode.

According to this configuration, in the case of the normal operation mode, which is not the correction mode, the detection value is corrected based on the correction target component calculated in the most recent correction mode. Accordingly, since frequency of the process of calculating the correction target component is reduced compared to the case where the correction target component is calculated each time the detection value is calculated, is processing load is likely to be reduced.

The capacitance detection device may include an analog-to-digital conversion unit that converts the detection signal to a digital signal in synchronization with a clock signal. The AC voltage output unit may output first and second AC voltages of a sine wave individually having a first frequency. The calculation unit may multiply a sine-wave synchronization signal synchronized with a clock signal and having the first frequency by the detection signal converted to a digital signal, and obtain a detection value in accordance with a demodulation signal obtained by removing harmonic components from a result of the multiplication.

According to this configuration, the synchronization signal having the same frequency as the first and second AC voltages is multiplied by the detection signal, and a detection value is obtained in accordance with a demodulation signal obtained by removing harmonic components from the multiplication result. Therefore, a highly accurate detection value may be obtained in accordance with the charge supplied to the detection electrode in accordance with the first and second AC voltages.

When the correction mode is entered, the correction unit may obtain a first detection value that is the detection value when the AC voltage output unit is controlled so that the difference between the amplitudes (the AC voltage amplitude difference) is a first amplitude difference and a second detection value that is the detection value when the AC voltage output unit is controlled so that the difference between the amplitudes (the AC voltage amplitude difference) is a second amplitude difference that is different from the first amplitude difference, and obtain the correction value in accordance with a difference between the first and second detection values.

According to this configuration, a correction value is obtained in accordance with the difference between the two detection values (the first and second detection values) obtained when the AC voltage amplitude difference is set to the two different amplitude differences (the first and second amplitude differences).

When the correction mode is entered, the correction unit may control the AC voltage output unit so that the first and second AC voltages are output in which the difference between the amplitudes (the AC voltage amplitude difference) is modulated by a modulation signal of a constant amplitude having the second frequency that is lower than the first frequency (the synchronization signal), and in addition obtain the correction value in accordance with an amplitude of an AC component of the second frequency included in the demodulation signal.

According to this configuration, since the AC voltage amplitude difference is modulated by a constant amplitude modulation signal of the second frequency, the demodulation signal includes an AC component of the second frequency corresponding to the modulation signal. A magnitude of the amplitude of the AC component corresponds to the change in the detection value due to the change in the AC voltage amplitude difference. Therefore, based on the amplitude of the AC component of the second frequency in the demodulation signal, a correction value may be obtained in accordance with the change in the detection value due to the change in the AC voltage amplitude difference.

The capacitance detection device may include an analog-to-digital conversion unit that converts the detection signal to a digital signal in synchronization with a clock signal. The AC voltage output unit may output first and second AC voltages of a sine wave individually having a first frequency. The calculation unit may multiply the first synchronization signal, which is synchronized with the clock signal, which has the first frequency, and which has a phase that is approximate to the first AC voltage, by the detection signal converted into a digital signal, multiply the second synchronization signal, which is synchronized with the clock signal, which has the first frequency and which has a phase shifted by a quarter cycle relative to the first synchronization signal, by the detection signal converted into a digital signal, and obtain a detection complex number having a real part corresponding to a first demodulation signal obtained by removing harmonic components from a result of the multiplication between the first synchronization signal and the detection signal and an imaginary part corresponding to a second demodulation signal obtained by removing harmonic components from a result of the multiplication between the second synchronization signal and the detection signal.

When the shift to the correction mode is performed, the correction unit controls the AC voltage output unit so that a difference between amplitudes (the AC voltage amplitude difference) changes and also obtains a complex number corresponding to a change in the detection complex number caused by the change in the difference between the amplitudes (the AC voltage amplitude difference) as a correction value. Furthermore, the correction unit performs a first phase correction on the first correction value, which is the correction value obtained in the correction mode in the initial state, to correct the phase so that an argument of the first correction value approaches zero, performs a second phase correction on the second correction value, which is the correction value obtained in the correction mode after the initial state, to correct the phase so that an argument of the second correction value approaches zero, and performs the second phase correction on the detection complex number. The correction unit may then obtain, as a corrected detection value, a numerical value obtained by correcting the real part of the detection complex number subjected to the second phase correction so that the correction target component, which is proportional to a difference between a real part of the first correction value subjected to the first phase correction and a real part of the second correction value subjected to the second phase correction and which corresponds to a change in the real part of the detection complex number caused by a change in the shield capacitance, is canceled out.

According to this configuration, the two synchronization signals (the first synchronization signal and the second synchronization signal) in an orthogonal relationship are individually multiplied by the detection signal and harmonic components are removed from results of the multiplication so that the two demodulation signals (the first demodulation signal and the second demodulation signal) are obtained and a detection complex number is obtained with the two demodulation signals as the real part and the imaginary part.

An argument of the detection complex number represents a phase shift of the detection signal relative to the first synchronization signal having a phase that is approximate to the first AC voltage. When the shift to the correction mode is performed, the AC voltage output unit is controlled so that the AC voltage amplitude difference changes, and a complex number corresponding to a change in the detection complex number caused by the change in the AC voltage amplitude difference is obtained as a correction value.

Since the argument of the detection complex number is substantially constant even when the AC voltage amplitude difference changes, the argument of the correction value represents a phase shift of the detection signal relative to the first synchronization signal as well as the argument of the detection complex number.

Here, when a phase and a frequency of the clock signal change (a jitter occurs), the frequencies of the two synchronization signals (the first and second synchronization signals) generated in synchronization with the clock signal change, and accordingly, the phases of the first and second AC voltages relative to the two synchronization signals change and the phases of the detection signal relative to the two synchronization signals change. On the other hand, since the two synchronization signals (the first and second synchronization signals) are individually generated in synchronization with the clock signal, relative phases of the synchronization signals do not change. Therefore, when the jitter of the clock signal occurs, the phase shift of the detection signal relative to the first synchronization signal changes, resulting in a change in the argument of the detection complex number and the argument of the correction value.

Therefore, in the correction unit, the first phase correction is performed on the first correction value obtained in the correction mode in the initial state, and the second phase correction is performed on the second correction value obtained in the correction mode after the initial state. Accordingly, the arguments of the first and second correction values individually approach zero. Furthermore, the correction unit performs the same second phase correction as the second correction value on the detection complex number.

Since the argument of the second correction value, as with the detection complex number, also represents the phase shift of the detection signal relative to the first synchronization signal, the argument of the detection complex number approaches approximately zero when the second phase correction is performed on the detection complex number. As a result, the arguments of the first correction value, the second correction value, and the detection complex number individually become around zero, and therefore, real parts of complex numbers are values from which the adverse effect of the jitter of the clock signal is largely removed.

Then, in the correction unit, the detection value in which the change in the shield capacitance has been corrected is obtained based on the real parts of the first correction value, the second correction value, and the detection complex number, from which the adverse effect of the jitter of the clock signal is removed. Specifically, since the correction target component, which is proportional to a difference between the real part of the first correction value subjected to the first phase correction and the real part of the second correction value subjected to the second phase correction, has a value corresponding to the change in the detection value caused by the change in the shield capacitance, the correction is performed on the real part of the detection complex number subjected to the second phase correction so that the correction target component is canceled out.

As for the detection value obtained in this way, an error caused by the change in the shield capacitance from the initial state and an error caused by the jitter of the clock signal are individually corrected.

When the correction mode is entered, the correction unit may obtain a first detection complex number that is the detection complex number when the AC voltage output unit is controlled so that the difference between the amplitudes (the AC voltage amplitude difference) is a first amplitude difference and a second detection complex number that is the detection complex number when the AC voltage output unit is controlled so that the difference between the amplitudes (the AC voltage amplitude difference) is a second amplitude difference that is different from the first amplitude difference, and obtain the correction value in accordance with a difference between the first and second detection complex numbers.

According to this configuration, a correction value is obtained according to the difference between the two detection complex numbers (the first and second detection complex numbers) obtained when the AC voltage amplitude difference is set to the two different amplitude differences (the first and second amplitude differences).

When the correction mode is entered, the correction unit may control the AC voltage output unit so that the first and second AC voltages are output in which the difference between the amplitudes (the AC voltage amplitude difference) is modulated by a modulation signal of a constant amplitude having a second frequency that is lower than the first frequency, and in addition, obtain a real part of the correction value in accordance with an amplitude of an AC component of the second frequency included in the first demodulation signal and an imaginary part of the correction value in accordance with an amplitude of an AC component of the second frequency included in the second demodulation signal.

According to this configuration, since the AC voltage amplitude difference is modulated by a constant amplitude modulation signal of the second frequency, the first and second demodulation signals include an AC component of the second frequency corresponding to the modulation signal. Since the amplitudes of the AC components in the two demodulation signals (the first and second demodulation signals) indicate changes in the detection complex number (the real part and the imaginary part) associated with the change in the AC voltage amplitude difference, a correction value (a real part and an imaginary part) is obtained based on the amplitudes of the AC components in accordance with the change in the detection complex number caused by the change in the AC voltage amplitude difference.

The correction unit may multiply a difference between the real part of the first correction value subjected to the first phase correction and the real part of the second correction value subjected to the second phase correction by a proportionality factor, and obtain a detection value that was corrected based on a sum of a result of the multiplication and a real part of the detection complex number subjected to the second phase correction.

The correction unit may perform the second phase correction for rotating a phase angle corresponding to an argument of the second correction value on an intermediate correction value corresponding to a sum of a complex number obtained by multiplying the second correction value by a proportionality factor and the detection complex number, and obtain the detection value that was corrected based on a result of a subtraction of a value obtained by multiplying a real part of the first correction value subjected to the first phase correction by the proportionality factor from a real part of the intermediate correction value subjected to the second phase correction.

The correction unit may obtain the second correction value each time the correction mode is entered, and in a normal operation mode, and obtain the detection value that was corrected based on the first correction value subjected to the first phase correction, the second correction value obtained in the correction mode that is most-recently performed, and the detection complex number.

According to this configuration, in the normal operation mode, which is not the correction mode, the corrected detection value is obtained based on the first correction value subjected to the first phase correction, the second correction value obtained in the most recent correction mode, and the detection complex number. Accordingly, it is easier to reduce a processing load compared to the case where the process associated with obtaining of the second correction value is executed each time the detection complex number is obtained.

When the object approaching the detection electrode does not exist in the normal operation mode, the AC voltage output unit may output the second AC voltage in which an amplitude is controlled so that the charge supplied from the node to the detection electrode approaches zero or the second AC voltage in which an amplitude of the detection signal is controlled to approach zero.

According to this configuration, the amplitude of the detection signal becomes smaller or approaches zero when an object proximate to the detection electrode does not exist in the normal operation mode, and therefore, a dynamic range of an output of the detection signal generation unit is easily ensured.

A second aspect of the present disclosure relates to a capacitance detection method employed in a capacitance detection device that detects a capacitance between an object that is proximate to a detection electrode and the detection electrode. In the capacitance detection method, the capacitance detection device includes an AC voltage output unit that outputs a first AC voltage to be supplied to a shield electrode disposed close to the detection electrode and a second AC voltage that has a frequency and a phase equivalent to those of the first AC voltage and that has an amplitude smaller than that of the first AC voltage, and a detection signal generation unit that supplies a charge to the detection electrode from a node so that a voltage of the node connected to the detection electrode approaches the second AC voltage and generates an AC detection signal in accordance with the supplied charge. The capacitance detection method includes a calculation step of calculating a detection value of a capacitance based on a detection signal, and a correction step of correcting a change in a detection value in accordance with a change in a shield capacitance that is a parasitic capacitance between a shield electrode and the detection electrode. The correction process includes repeatedly shifting to the correction mode, controlling the AC voltage output unit so that a difference in amplitudes of a first AC voltage and a second AC voltage changes when a correction mode is entered, acquiring a correction value in accordance with a change in the detection value caused by a change in the difference between the amplitudes, and correcting the detection value in accordance with a change in the correction value acquired in the correction mode.

According to a third aspect of the present disclosure, an input device includes a detection electrode in which a capacitance between a detection electrode and an object changes in accordance with an approach of the object, a shield electrode disposed in proximity to the detection electrode, and the capacitance detection device according to the first aspect which detects a capacitance between the object and the detection electrode.

First Embodiment

FIG. 1 is a diagram illustrating an example of a configuration of an input device according to an embodiment of the present invention. The input device illustrated in FIG. 1 includes a sensor unit 1, a capacitance detection device 2, a processing unit 3, a storage unit 4, and an interface unit 5.

The input device according to this embodiment detects an electrostatic capacitance between an electrode disposed on the sensor unit 1 and an object when an object 6, such as a finger or a pen, is brought into proximity to the sensor unit 1, and inputs information corresponding to the proximity of the object 6 based on a result of the detection.

For example, the input device acquires information, such as the proximity of the object 6 to the sensor unit 1 and a distance between the sensor unit 1 and the object 6 based on the capacitance detection result. The input device is applied to user interface devices, such as touch sensors and touch pads, for example. The term "proximity" in this specification means being in close proximity, and is not limited to whether there is contact between objects in close proximity.

The sensor unit 1 has a detection electrode Es for detecting the proximity of the object 6, such as a finger or a pen, and a shield electrode Ea positioned proximate to the detection electrode Es. The detection electrode Es is located in the sensor unit 1 in a region where the object is to be in close proximity. For example, a surface of a detection region of the object 6 is covered with an insulating cover layer, and the detection electrode Es is placed below the cover layer. The shield electrode Ea is an electrostatic shield that prevents electrostatic coupling between a conductor other than the object 6 and the detection electrode Es. The shield electrode Ea, for example, is positioned lower than the detection electrode Es in the detection region of the object 6.

As illustrated in FIG. 1, a capacitor Crg is formed between the detection electrode Es and the object 6, which is a capacitance to be detected. A capacitor Crs is formed between the shield electrode Ea and the detection electrode Es. A capacitor Crgl is formed between the detection electrode Es and the ground, and a capacitor Csg is formed between the shield electrode Ea and the ground.

The capacitance detection device 2 detects a capacitance of the capacitor Crg formed between the object 6 and the detection electrode Es, and outputs a detection value Ds indicating a result of the detection.

The processing unit 3 is a circuit that controls an entire operation of the input device and includes, for example, a computer that executes processing in accordance with an instruction code of a program stored in the storage unit 4 and hardware (e.g., ASIC, FPGA, or other logic circuit) configured to perform a specific function. The processing performed by the processing unit 3 may be realized in the computer based on the program, or at least a portion of the processing may be realized by dedicated hardware.

The processing unit 3 determines whether the object 6 is in proximity to the sensor unit 1 and calculates a distance between the object 6 and the sensor unit 1 based on the detection value Ds of the capacitance output from the capacitance detection device 2. Note that the sensor unit 1 may include a plurality of detection electrodes Es, and the capacitance detection device 2 may detect capacitances of capacitors Crg of the individual detection electrodes Es. The processing unit 3 may calculate a proximity position of the object 6 relative to the sensor unit 1 and a size of the object 6 based on the detection value Ds of the capacitances obtained by the individual detection electrodes Es.

The storage unit 4 stores programs for the computer included in the processing unit 3, data to be used for processing in the processing unit 3, and data to be temporarily held in course of the processing. The storage unit 4 is constituted by any storage device, such as a DRAM, an SRAM, a flash memory, a hard disk, etc.

The interface unit 5 is a circuit for exchanging data between the input device and another device (e.g., a host controller of an electronic device having the input device). The processing unit 3 outputs information obtained based on the detection result of the capacitance detection device 2

(presence or absence of the object 6, the proximity position of the object 6, the distance to the object 6, the size in the object 6, etc.) to a higher-level device not shown in the figure by the interface unit 5. The higher-level device uses this information to configure a user interface that recognizes, for example, pointing operations and gesture operations.

Figure 2:
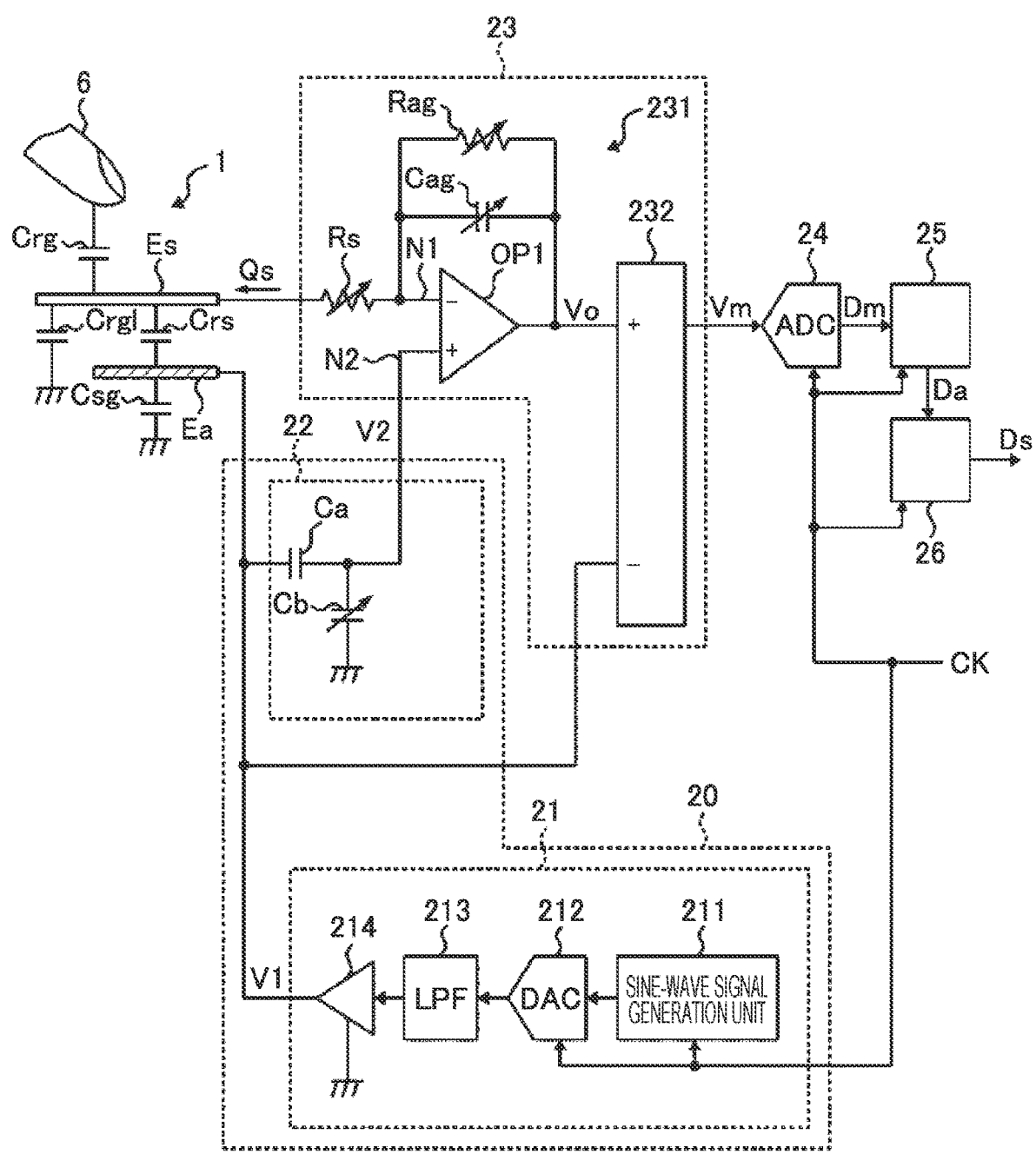
FIG. 2 is a diagram illustrating an example of a configuration of a capacitance detection device according to the embodiment.

Next, the configuration of the capacitance detection device 2 will be described. FIG. 2 is a diagram illustrating an example of a configuration of the capacitance detection device 2 according to this embodiment. The capacitance detection device 2 illustrated in FIG. 2 includes an AC voltage output unit 20, a detection signal generation unit 23 that generates a detection signal Vm, an analog-to-digital conversion unit 24, a calculation unit 25, and a correction unit 26. Note that, in the following description, "analog-to-digital conversion" may be abbreviated as "A/D conversion" and "digital-to-analog conversion" as "D/A conversion" where appropriate.

The AC voltage output unit 20 outputs a first AC voltage V1 to be supplied to the shield electrode Ea and a second AC voltage V2 of a smaller amplitude than the first AC voltage V1. The first and second AC voltages V1 and V2 have the same frequency f1 and are roughly in phase with each other. For example, the first and second AC voltages V1 and V2 are sine-wave AC voltages, with a constant DC bias (e.g., half a DC voltage relative to a power supply voltage) added thereto.

In the example in FIG. 2, the AC voltage output unit 20 includes a first voltage output unit 21 and a second voltage output unit 22.

The first voltage output unit 21 is a circuit that generates the first AC voltage V1 of a sine wave. The first voltage output unit 21 includes a sine-wave signal generation unit 211, a D/A conversion unit 212, a low-pass filter 213, and an amplifier 214, as illustrated in FIG. 2, for example. The sine-wave signal generation unit 211 generates a sine-wave digital signal (a data string of sine-wave numerical data) synchronized with a clock signal CK and supplies the sine-wave digital signal to the D/A conversion unit 212. The D/A conversion unit 212 outputs an analog signal corresponding to the sine-wave digital signal. The low-pass filter 213 removes high frequency components from an analog signal output from the D/A conversion unit 212 and outputs a sine-wave signal of the frequency f1. The amplifier 214 is a buffer amplifier and outputs the first AC voltage V1 according to the sine-wave signal output from the low-pass filter 213.

The second voltage output unit 22 is a circuit that outputs the second AC voltage V2 whose frequency and phase are equal to the first AC voltage V1 and whose amplitude is smaller than the first AC voltage V1, and is constituted by an attenuation circuit that attenuates the amplitude of the first AC voltage V1, for example.

In the example in FIG. 2, the second voltage output unit 22 includes a series circuit of capacitors Ca and Cb. The first voltage output unit 21 applies the first AC voltage V1 to opposite ends of the series circuit. The first AC voltage V1 is divided to be supplied to the capacitor Ca and the capacitor Cb, and therefore, the second AC voltage V2 is generated in the capacitor Cb. One terminal of the capacitor Ca is connected to an output of the first voltage output unit 21, the other terminal of the capacitor Ca is connected to one terminal of the capacitor Cb, and the other terminal of the capacitor Cb is connected to the ground.

As one example, the capacitor Ca has a constant capacitance and the capacitance of the capacitor Cb is adjustable. The amplitude of the second AC voltage V2 is adjusted in accordance with the capacitance of the capacitor Cb. In this case, the capacitor Cb may be a discrete component with a variable capacitance or a component formed on a semiconductor chip or the like inside an IC. In the latter case, for example, the capacitor Cb is constituted by a plurality of capacitors connected in parallel, and the capacitance is adjusted by changing the number of capacitors connected in parallel by a switch or the like.

The amplitude of the second AC voltage V2 is adjusted so that a charge Qs supplied from the detection signal generation unit 23 to the detection electrode Es becomes approximately zero when there is no object 6 in proximity to the detection electrode Es (when the capacitance of the capacitor Crg is close to zero) in a normal operation mode which is not a correction mode described below. In the second voltage output unit 22 illustrated in FIG. 2, a capacitance rate between the capacitors Ca and Cb is adjusted so that the charge Qs supplied from the detection signal generation unit 23 to the detection electrode Es becomes approximately zero. When the charge Qs is zero with the capacitor Crg at zero, a charge supplied to the capacitor Crs cancels out a charge supplied to the parasitic capacitor Crgl. Therefore, by adjusting the amplitude of the second AC voltage V2 so that the charge Qs becomes approximately zero, a component of the parasitic capacitor Crgl included in the detection signal Vm described below in the detection signal generation unit 23 becomes minute, and accordingly, it is easier to suppress degradation in detection sensitivity and detection accuracy caused by the parasitic capacitor Crgl.

Alternatively, the amplitude of the second AC voltage V2 may be adjusted so that the amplitude of the detection signal Vm approaches zero. Since the amplitude of the detection signal Vm is close to zero when there is no object 6 in proximity to the detection electrode Es, a dynamic range of the detection signal Vm with respect to a capacitance of a detection target (a capacitance of the capacitor Crg) becomes wider, and accordingly, it is easier to increase detection sensitivity.

The detection signal generation unit 23 supplies the charge Qs from a node N1 to the detection electrode Es so that a voltage of the node N1 connected to the detection electrode Es approaches the second AC voltage V2, and generates the AC detection signal Vm in accordance with the supplied charge Qs.

In the example of FIG. 2, the detection signal generation unit 23 includes a charge amplifier 231 and a subtraction unit 232. The charge amplifier 231 supplies the charge Qs from the node N1 to the detection electrode Es so that the voltage of the node N1 approaches the second AC voltage V2 applied to a node N2, and outputs a signal Vo corresponding to the supplied charge Qs. The charge amplifier 231 includes an operational amplifier OP1, a feedback capacitor Cag, and a feedback resistor Rag, as illustrated in FIG. 2, for example. The operational amplifier OP1 amplifies a voltage difference between an inverting input terminal connected to the node N1 and a non-inverting input terminal connected to the node N2, and outputs a result of the amplification as the signal Vo.

The feedback capacitor Cag is provided in a path between an output terminal for the signal Vo of the operational amplifier OP1 and the inverting input terminal. The feedback resistor Rag is connected in parallel to the feedback capacitor Cag.

In the example in FIG. 2, a capacitance value of the feedback capacitor Cag and a resistance value of the feedback resistor Rag are individually adjustable. By adjusting the values of these elements, the phase differences between the first and second AC voltages V1 and V2 and the signal Vo and a gain of the amplitude of the signal Vo relative to the capacitance of the capacitor Crg are adjusted.

The feedback capacitor Cag and the feedback resistor Rag can be discrete components having adjustable element values, for example, or components inside the IC that have element values adjustable by laser trimming or the like.

Furthermore, in the example in FIG. 2, the charge amplifier 231 has a resistor Rs disposed in a path connecting the node N1 to the detection electrode Es. Since the charge amplifier 231 has the resistor Rs, a low-pass filter is configured for a signal input from the object 6 through the capacitor Crg. Therefore, even when an AC noise voltage is superimposed between the ground to which the object 6 is grounded and the ground of the capacitance detection device 2, the noise voltage is attenuated by the low-pass filter configured by the charge amplifier 231. The resistor Rs is, for example, a variable resistor and is adjusted in accordance with the frequency f1 of the first AC voltage V1 and the second AC voltage V2.

The subtraction unit 232 subtracts a predetermined reference signal from the signal Vo. The reference signal is equivalent to the signal Vo output from the operational amplifier OP1 when there is no object 6 in proximity to the detection electrode Es in the normal operation mode which is not the correction mode. By subtracting the reference signal from the signal Vo, the AC detection signal Vm of an amplitude roughly proportional to the capacitance of the capacitor Crg is obtained.

The subtraction unit 232 includes, for example, an all-differential amplifier, which outputs a differential signal obtained by subtracting the reference signal from the signal Vo as the detection signal Vm.

Figure 3:
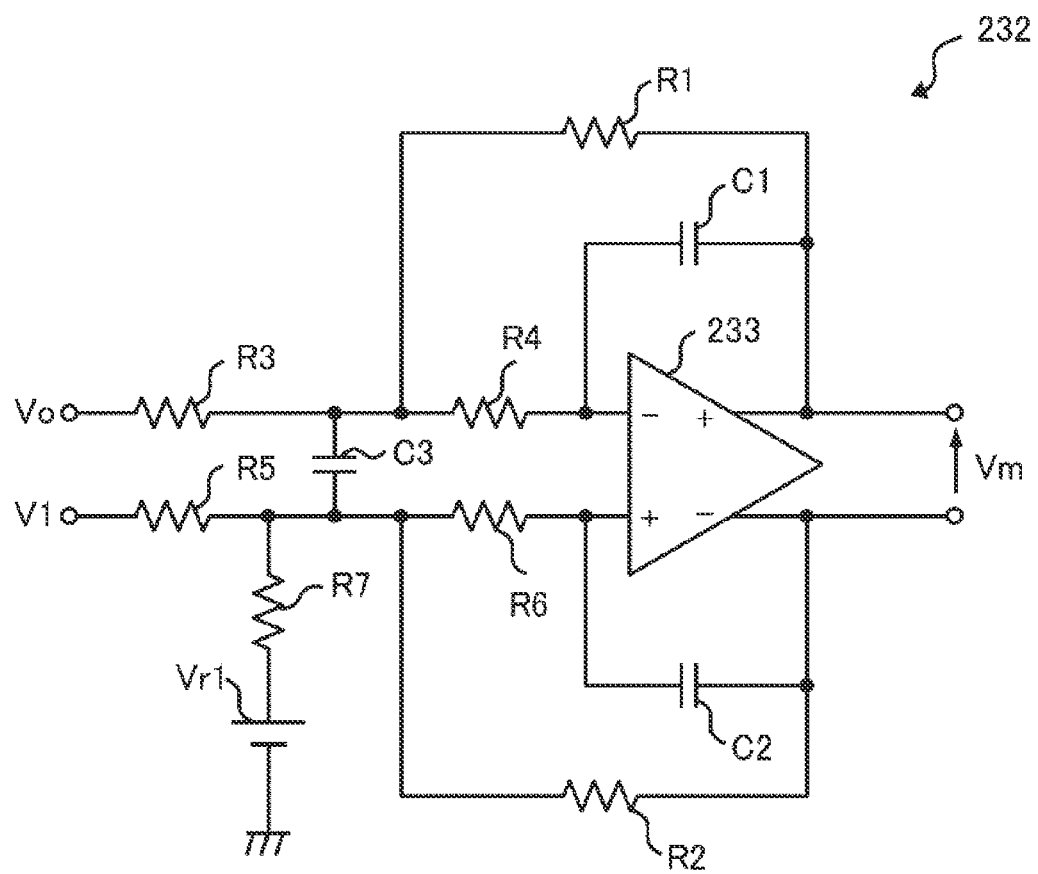
FIG. 3 is a diagram illustrating an example of a configuration of a subtraction circuit.

FIG. 3 is a diagram illustrating an example of a configuration of the subtraction unit 232. In the example in FIG. 3, the subtraction unit 232 has an all-differential amplifier 233, resistors R1 to R7, and capacitors C1 to C3. The capacitor C1 is connected between an inverting input terminal and a non-inverting output terminal of the all-differential amplifier 233. The capacitor C2 is connected between a non-inverting input terminal and an inverting output terminal of the all-differential amplifier 233. The signal Vo of the charge amplifier 231 is input to the inverting input terminal of the all-differential amplifier 233 through the resistors R3 and R4 which are connected in series. The signal Vo is input to one end of the resistor R3, and the inverting input terminal of the all-differential amplifier 233 is connected to one end of the resistor R4. A connection midpoint between the resistors R3 and R4 is connected to the non-inverting output terminal of the all-differential amplifier 233 via the resistor R1. The first AC voltage V1 is input to the non-inverting input terminal of the all-differential amplifier 233 via the resistors R5 and R6 which are connected in series. The first AC voltage V1 is input to one end of the resistor R5, and the non-inverting input terminal of the all-differential amplifier 233 is connected to one end of the resistor R6. A connection midpoint between the resistors R5 and R6 is connected to the inverting output terminal of all-differential amplifiers 233 via the resistor R2. The capacitor C3 is connected between the connection midpoint between the resistors R3 and R4 and the connection midpoint between the resistors R5 and R6. A DC bias voltage Vr1 is input to the connection midpoint between the resistors R5 and R6 via the resistor R7.

In the subtraction unit 232 illustrated in FIG. 3, gains for the two inputs (the signal Vo and the first AC voltage V1) are different from each other. In other words, the gain to the first AC voltage V1 input to a path to which the resistor R7 is connected is smaller than the gain to the signal Vo. The subtraction unit 232 amplifies a difference between the AC voltage (a reference signal) which is attenuated when compared with the first AC voltage V1 and the signal Vo, and outputs a result of the amplification as a differential signal (the detection signal Vm). The subtraction unit 232 also constitutes a low-pass filter, which removes high-frequency components input from the object 6 through the capacitor Crg. A function of the low-pass filter reduces a fold-back noise in the A/D conversion unit 24 described below.

Returning to FIG. 2. The A/D conversion unit 24 converts the analog detection signal Vm output from the detection signal generation unit 23 into a digital detection signal Dm. When the detection signal Vm is a differential signal, a Delta-Sigma type A/D conversion unit employing a differential input method may be used as the A/D conversion unit 24, for example.

The calculation unit 25 calculates a detection value of a capacitance based on the detection signal Dm obtained by A/D conversion performed on the detection signal Vm.

For example, the calculation unit 25 multiplies a first synchronization signal U1, which is synchronized with the clock signal CK, which has the frequency f1, and which approximates its phase to the first AC voltage V1, by the detection signal Dm, which is a digital signal obtained by the conversion. The calculation unit 25 also multiplies a second synchronization signal U2, which is synchronized with the clock signal CK, which has the frequency f1, and which has a phase shifted by a quarter cycle relative to the first synchronization signal U1, by the detection signal Dm, which is a digital signal obtained by the conversion. Then, the calculation unit 25 obtains a detection complex number Da, where a first demodulation signal I obtained by removing harmonic components from a result of the multiplication of the first synchronization signal U1 and the detection signal Dm is a real part and a second demodulation signal Q obtained by removing harmonic components from a result of the multiplication of the second synchronization signal U2 and the detection signal Dm is an imaginary part.

Here, the first demodulation signal I (the real part of the detection complex number Da) obtained by removing harmonic components from the result of the multiplication of the first synchronization signal U1 having the phase approximating the first AC voltage V1 by the detection signal Dm has a value corresponding to an amplitude of the detection signal Vm, and therefore, corresponds to a detection value of the capacitance of the capacitor Crg to be detected. However, the detection value (the first demodulation signal I) includes an error caused by a change in a capacitance of the capacitor Crs (hereinafter referred to as a "shield capacitance Crs" where appropriate) and an error caused by a change (jitter) in a phase and a frequency of the clock signal CK. Therefore, the correction unit 26, described below, corrects these errors.

The two sine-wave synchronization signals (U1 and U2) are in the orthogonal relationship with a quarter cycle shift in phase, and therefore, the two demodulation signals (I and Q) obtained by multiplying the detection signal Dm and the two synchronization signals (U1 and U2), respectively and removing harmonic components, represent phases of the detection signal Dm relative to the synchronization signals (U1 and U2). In other words, an argument of the detection complex number Da, where the first demodulation signal I obtained by removing harmonic components from the result of the multiplication between the sine-wave first synchronization signal U1 and the detection signal Dm is determined as a real part and the second demodulation signal Q obtained by removing harmonic components from the result of the multiplication between the sine-wave second synchronization signal U2 and the detection signal Dm is determined as an imaginary part, represents a phase shift of the detection signal Dm relative to the first synchronization signal U1. Therefore, the detection complex number Da includes information on the amplitude of the detection signal Dm and the phase of the detection signal Dm with respect to the first synchronization signal U1.

Figure 4:
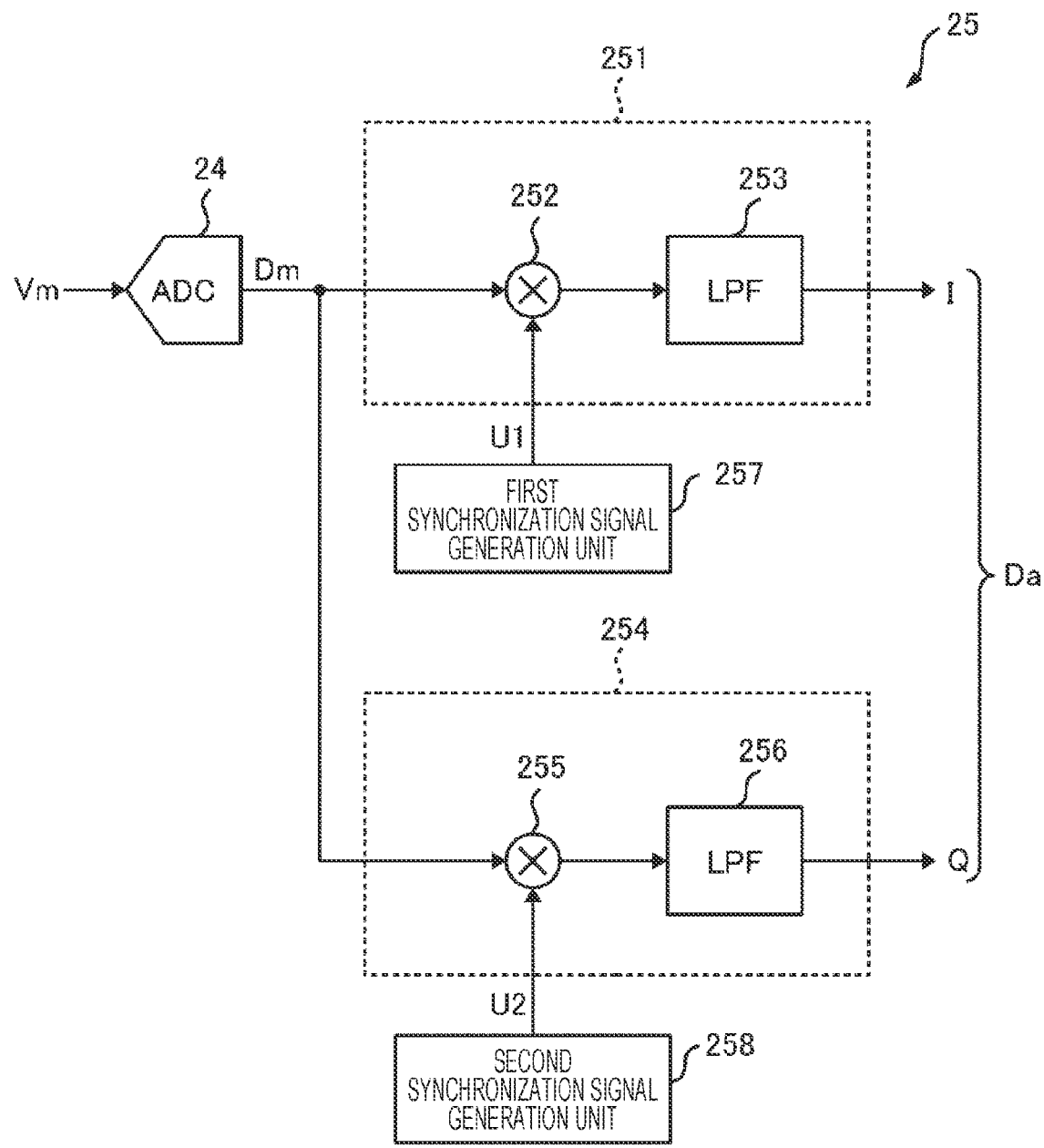
FIG. 4 is a diagram illustrating an example of a configuration of a calculation unit.

FIG. 4 is a diagram illustrating an example of a configuration of the calculation unit 25. The calculation unit 25 includes a first demodulation unit 251 and a second demodulation unit 254, for example, as illustrated in FIG. 4.

The first demodulation unit 251 multiplies the sine-wave first synchronization signal U1 generated in a first synchronization signal generation unit 257 by the detection signal Dm and generates a first demodulation signal I with harmonic components removed from a result of the multiplication. In the example in FIG. 4, the first demodulation unit 251 includes a multiplier 252 that multiplies the detection signal Dm by the first synchronization signal U1, and a low-pass filter 253 that removes harmonic components from a result of the multiplication of the multiplier 252.

The second demodulation unit 254 multiplies the sine-wave second synchronization signal U2 generated in a second synchronization signal generation unit 258 by the detection signal Dm and generates the second demodulation signal Q with harmonic components removed from a result of the multiplication. In the example in FIG. 4, the second demodulation unit 254 includes a multiplier 255 that multiplies the detection signal Dm by the second synchronization signal U2, and a low-pass filter 256 that removes harmonic components from a result of the multiplication of the multiplier 255.

The first synchronization signal generation unit 257 and the second synchronization signal generation unit 258 generate the first synchronization signal U1 and the second synchronization signal U2, respectively, which are sine waves of the frequency f1 synchronized with the clock signal CK. In one example, the first synchronization signal generation unit 257 generates a COS wave of the frequency f1 as the first synchronization signal U1, and the second synchronization signal generation unit 258 generates a SIN wave with a phase delayed by a quarter cycle relative to the first synchronization signal U1 as the second synchronization signal U2.

Returning to FIG. 2. The correction unit 26 corrects a change in a detection value of the calculation unit 25 caused by a change in the capacitance (the shield capacitance Crs) of the capacitor Crs formed between the shield electrode Ea and the detection electrode Es. In this correction process, the correction unit 26 repeatedly performs a shift to the correction mode. When the shift to the correction mode is performed, the correction unit 26 controls the AC voltage output unit 20 so that a difference between amplitudes of the first AC voltage V1 and the second AC voltage V2 (V1−V2: an AC voltage amplitude difference) changes and also obtain a correction value corresponding to a change in the detection value of the calculation unit 25 in accordance with the change in the AC voltage amplitude difference (V1−V2). The correction unit 26 then corrects the detection value of the calculation unit 25 in accordance with the change in the correction value obtained in the correction mode, and obtains the detection value Ds as a result of the correction.

The following explains the change in an amplitude of the signal Vo as the shield capacitance Crs changes. The voltage amplitude of the signal Vo output at the charge amplifier 231 is expressed by the following equation:

$$Vo = V2 \cdot \frac{Crg + Crgl}{Cag} - (V1 - V2) \cdot \frac{Crs}{Cag} + V2 \tag{1}$$

In Equation (1), "Vo," "V1," and "V2" represent voltage amplitudes of the signal Vo, the first AC voltage V1, and the second AC voltage V2, respectively, and "Crg," "Crgl," "Crs," and "Cag" represent capacitances of the capacitors Crg, Crgl, Crs, and Cag, respectively.

It is now assumed that the amplitude of the first AC voltage V1 is held constant and the amplitude of the second AC voltage V2 is varied by "ΔV". Assuming that the capacitances of the individual capacitors (Crg, Crgl, Crs, Cag) remain unchanged, the change in an amplitude ΔVo of the signal Vo is represented by the following expression:

$$\Delta Vo = \frac{Crg + Crgl + Crs + Cag}{Cag} \cdot \Delta V \tag{2}$$

Assuming that the shield capacitance Crs in the initial state is "Crs_ref", the change in an amplitude ΔVo_ref of the signal Vo obtained when the amplitude of the second AC voltage V2 is changed by "ΔV" in the initial state is represented by the following equation:

$$\Delta Vo\_ref = \frac{Crg + Crgl + Crs\_ref + Cag}{Cag} \cdot \Delta V \tag{3}$$

The change ΔCrs in the shield capacitance Crs from the initial state is represented by the following equation according to Equations (2) and (3):

$$\Delta Crs = Crs - Crs\_ref = \frac{Cag \cdot (\Delta Vo - \Delta Vo\_ref)}{\Delta V} \tag{4}$$

However, in Equation (4), it is assumed that the changes in the capacitances of the capacitors Crg, Crgl, and Cag are sufficiently small and negligible compared to the change ΔCrs in the shield capacitance Crs.

On the other hand, the change ΔVo_crs in the amplitude of the signal Vo due to the change ΔCrs in the shield capacitance Crs is represented by the following equation:

$$\Delta Vo\_crs = \frac{-(V1 - V2)}{Cag} \cdot \Delta Crs \tag{5}$$

Also in Equation (5), it is assumed that the changes in capacitances of the capacitors Crg, Crgl, and Cag are sufficiently small and negligible compared to the change ΔCrs in the shield capacitance Crs.

Substituting Equation (4) into Equation (5), the change ΔVo_crs in the amplitude of the signal Vo with a change ΔCrs in the shield capacitance Crs is expressed by the following expression:

$$\Delta Vo\_crs = -\alpha \cdot (\Delta Vo - \Delta Vo\_ref) \tag{6}$$

A proportionality factor α in Equation (6) is represented by the following equation:

$$\alpha = \frac{(V1 - V2)}{\Delta V} \tag{7}$$

When the shield capacitance Crs has changed by "ΔCrs" compared to the initial state, due to this change in the shield capacitance Crs, the amplitude of the signal Vo includes a change (an error) equivalent to "ΔVo_crs" in Equation (6). Therefore, by subtracting this "ΔVo_crs" from the amplitude "Vo", the change in the amplitude (the error) of the signal Vo caused by the change ΔCrs in the shield capacitance Crs is corrected. The amplitude of the corrected signal Vo is represented by the following equation:

$$Vo - \Delta\text{Vo\_crs} = Vo + \alpha \cdot (\Delta Vo - \Delta\text{Vo\_ref}) \quad (8\text{-}1)$$

$$= V2 \cdot \frac{Crg + Crgl}{Cag} - (V1 - V2) \cdot \frac{\text{Crs\_ref}}{Cag} + V2 \quad (8\text{-}2)$$

As can be seen by comparing Equation (1) with Equation (8-2), the amplitude calculated by applying the correction of Equation (8-1) to the amplitude of the signal Vo is equivalent to the amplitude of the signal Vo obtained when the shield capacitance Crs, which has changed from the initial state, is returned to the shield capacitance Crs_ref in the initial state.

The correction unit 26 obtains correction values corresponding to "ΔVo_ref" and "ΔVo" in Equation (8-1) in each correction mode to perform the correction in Equation (8-1). This correction value corresponds to the change in the detection value of the calculation unit 25 in accordance with the change ΔV in the AC voltage amplitude difference (V1−V2). "ΔVo_ref" corresponds to a correction value (a first correction value) obtained in the correction mode in the initial state, and "ΔVo" is a correction value obtained in the correction mode after the initial state (a second correction value).

After obtaining the two correction values corresponding to "ΔVo_ref" and "ΔVo," the correction unit 26 performs a correction corresponding to Equation (8-1) on the detection value of the calculation unit 25 corresponding to "Vo." In other words, as "Vo" is corrected in accordance with the change in "ΔVo" relative to "ΔVo_ref" (ΔVo−ΔVo_ref) in Equation (8-1), the correction unit 26 corrects the detection value of the calculation unit 25 in accordance with the change in the correction value (the second correction value− the first correction value) obtained in the correction mode. In this way, the correction unit 26 compensates for the change (the error) in the detection value of the calculation unit 25 caused by the change in the shield capacitance Crs.

In addition to the correction for the error in the detection value caused by the change in the shield capacitance Crs, the correction unit 26 also corrects the error in the detection value caused by the jitter of the clock signal CK.

When the relative phase of the first and second AC voltages V1 and V2 and the first and second synchronization signals U1 and U2 changes due to the jitter of the clock signal CK, the argument of the detection complex number Da obtained by the calculation unit 25 changes in accordance with the change in the phase. When the argument of the detection complex number Da changes, its real part (the first demodulation signal I) also changes. Therefore, the real part of the detection complex number Da (the first demodulation signal I), which corresponds to the detection value of a capacitance calculated by the calculation unit 25, is affected by the jitter of the clock signal CK, resulting in an error.

The correction unit 26 obtains a complex number including information on the phase as a correction value in the correction mode described above in order to correct the error in the detection value due to the jitter of the clock signal CK.

That is, when the shift to the correction mode is performed, the correction unit 26 controls the AC voltage output unit 20 so that the AC voltage amplitude difference (V1−V2) changes and also obtains a complex number corresponding to a change in the detection complex number Da caused by the change in the AC voltage amplitude difference (V1−V2) as a correction value.

The correction unit 26 applies a first phase correction to the first correction value B1, which is the correction value obtained in the correction mode in the initial state, to correct the phase so that an argument θ1 of the first correction value B1 approaches zero. In the first phase correction, a phase angle is rotated by "−θ1".

Furthermore, the correction unit 26 applies a second phase correction to the second correction value B2, which is the correction value obtained in the correction mode after the initial state, to correct the phase so that an argument θ2 of the second correction value B2 approaches zero. In the second phase correction, a phase angle is rotated by "−θ2".

Furthermore, the correction unit 26 performs the same second phase correction as the second correction value B2 on the detection complex number Da. Since the argument of the detection complex number Da is generally constant even when the AC voltage amplitude difference (V1−V2) changes, the argument θ2 of the second correction value according to the change in the detection complex number Da caused by the change in the AC voltage amplitude difference (V1−V2) has a value close to the argument of the detection complex number Da. Therefore, when the second phase correction is performed on the detection complex number Da, the argument of the detection complex number Da also approaches zero.

Therefore, the arguments of the first correction value B1, the second correction value B2, and the detection complex number Da are individually close to zero due to phase correction individually performed, and the change in the argument of the detection complex number Da caused by the jitter of the clock signal CK is eliminated. When the arguments of the first correction value B1, the second correction value B2, and the detection complex number Da are close to zero, the imaginary parts thereof are individually close to zero. The real parts of the first correction value B1, the second correction value B2, and the detection complex number Da have values corresponding to "ΔVo_ref", "ΔVo", and "Vo" in Equation (8-1), respectively.

The correction unit 26 corrects the real part of the detection complex number Da subjected to the second phase correction so that a correction target component (ΔVo_crs, Equation (6)) that is proportional to the difference (ΔVo− ΔVo_ref) between the real part (ΔVo_ref) of the first correction value B1 subjected to the first phase correction and the real part (ΔVo) of the second correction value B2 subjected to the second phase correction and that corresponds to a change in the real part of the detection complex number Da caused by a change in the shield capacitance Crs is canceled out (Equation (8-1)). As a result, the correction unit 26 obtains a detection value Ds in which the error due to the change ΔCrs in the shield capacitance Crs and the error due to the jitter of the clock signal CK are individually corrected.

After the initial state, the correction unit 26 obtains the second correction value B2 each time the shift to the correction mode is performed. In the normal operation mode other than the correction mode, the correction unit 26 obtains a corrected detection value Ds based on the first correction value B1 subjected to the first phase correction, the second correction value B2 obtained in the most recent correction mode, and the detection complex number Da.

Figure 5:
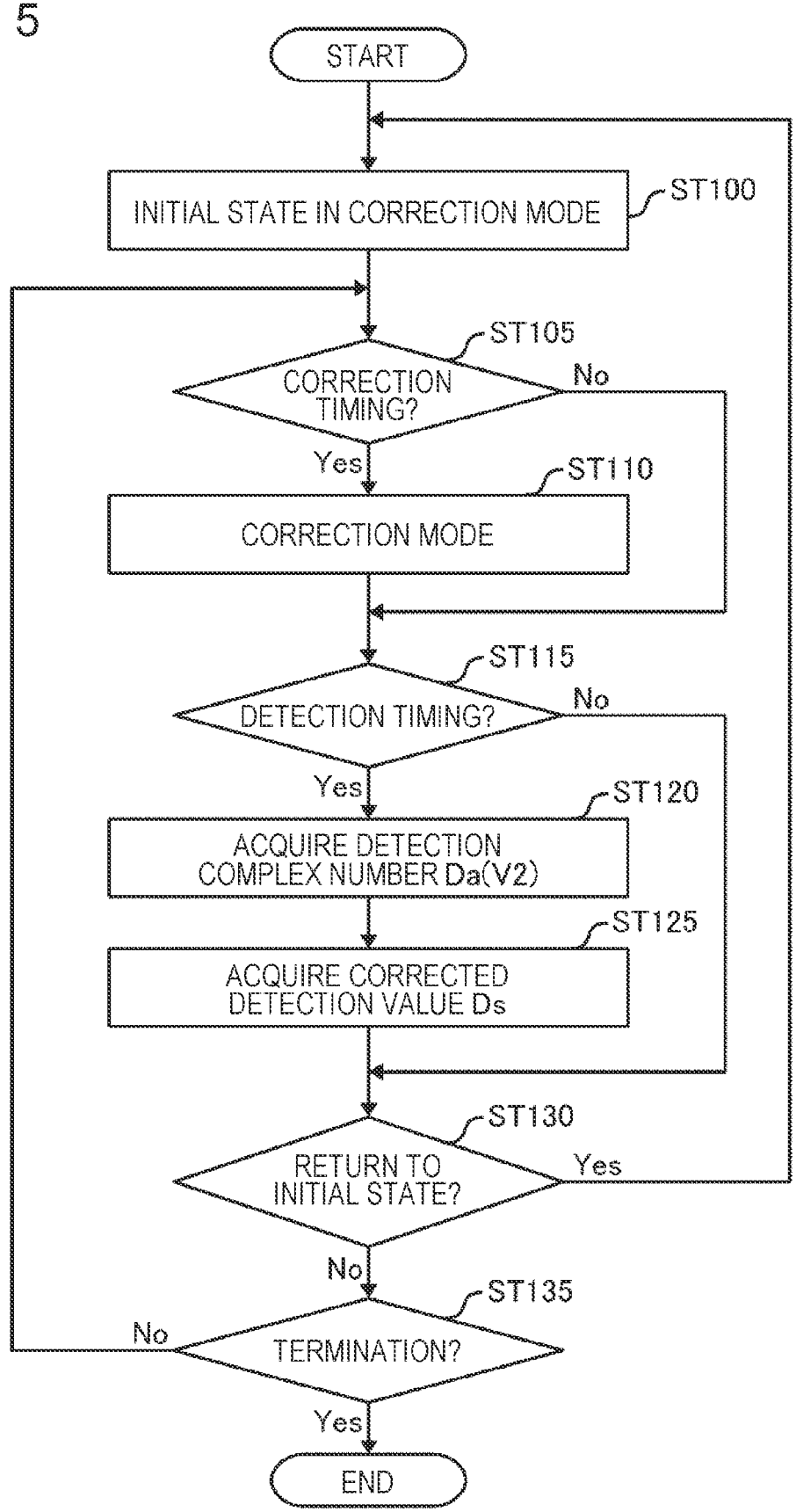
FIG. 5 is a flowchart of an example of a capacitance detection method according to a first embodiment.

Next, a capacitance detection method employed in the capacitance detection device 2 of the input device having the configuration described above will be described with reference to a flowchart. FIG. 5 is a flowchart of an example of the capacitance detection method according to the first embodiment.

For example, at startup when the power supply is turned on or when an instruction for setting an initial state is input from the processing unit 3, the capacitance detection device 2 enters the correction mode in the initial state (ST100).

Figure 6:
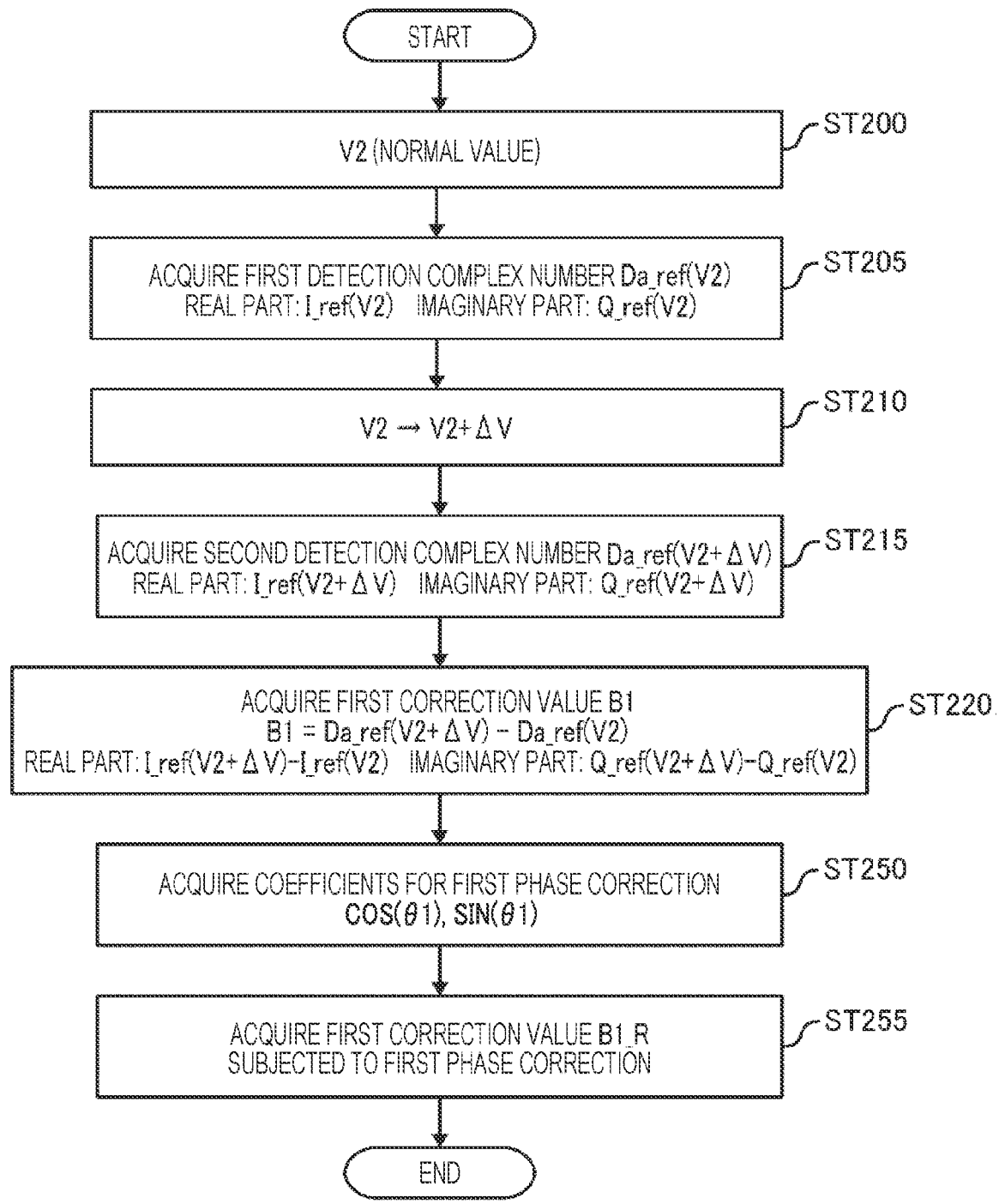
FIG. 6 is a flowchart of an example of a process in a correction mode in an initial state in the capacitance detection method of FIG. 5.

FIG. 6 is a flowchart of an example of a process in the correction mode (ST100) in the initial state in the capacitance detection method illustrated in FIG. 5.

First, the correction unit 26 controls the AC voltage output unit 20 (the second voltage output unit 22) so that the amplitude of the second AC voltage V2 becomes a normal value (ST200). It is assumed here that the normal amplitude of the second AC voltage V2 is "V2". An AC voltage amplitude difference, which is a difference between an amplitude of the first AC voltage V1 and an amplitude of the second AC voltage V2, is "V1–V2". Hereinafter, the AC voltage amplitude difference of "V1–V2" may be referred to as the "first amplitude difference". In this case, the correction unit 26 controls the AC voltage output unit 20 so that the AC voltage amplitude difference is the first amplitude difference "V1–V2".

The calculation unit 25 obtains the detection complex number Da as "a first detection complex number Da_ref (V2)" when the second AC voltage V2 is of a normal amplitude "V2" (when the AC voltage amplitude difference is the first amplitude difference "V1-V2") in the correction mode in the initial state (ST205).

A real part of the first detection complex number Da_ref (V2) is "I_ref(V2)", and an imaginary part of the first detection complex number Da_ref(V2) is "Q_ref(V2)".

Next, the correction unit 26 controls the AC voltage output unit 20 (the second voltage output unit 22) so that the amplitude of the second AC voltage V2 becomes higher than the normal value by "ΔV" (ST 210). The AC voltage amplitude difference is "V1–(V2+ΔV)". Hereinafter, the AC voltage amplitude difference of "V1–(V2+ΔV)" is referred to as a "second amplitude difference" where appropriate. In this case, the correction unit 26 controls the AC voltage output unit 20 so that the AC voltage amplitude difference becomes the second amplitude difference "V1–(V2+ΔV)".

The calculation unit 25 obtains the detection complex number Da as "a second detection complex number Da_ref (V2+ΔV)" when the amplitude of the second AC voltage V2 is "V2+ΔV" (when the AC voltage amplitude difference is the second amplitude difference "V1-(V2+ΔV)") in the correction mode in the initial state (ST215). A real part of the second detection complex number Da_ref(V2+ΔV) is "I_ref (V2+ΔV)", and an imaginary part of the second detection complex number Da_ref(V2+ΔV) is "Q_ref(V2+ΔV)".

In the initial state of the correction mode, the correction unit 26 obtains a first correction value B1 in accordance with a change in the detection complex number Da caused by a change in the AC voltage amplitude difference ΔV (ST220). The correction unit 26 obtains a complex number as the first correction value B1 by subtracting the first detection complex number Da_ref(V2) from the second detection complex number Da_ref(V2+ΔV).

The correction unit 26 obtains a coefficient to be used for a first phase correction for correcting a phase so that the argument θ1 of the first correction value B1 approaches zero (ST 250). The first phase correction is a rotation transform that rotates the phase angle by "−θ1". Assuming that a real part and an imaginary part of the first correction value B1 before the first phase correction is performed are denoted by "Re{B1}" and "Im{B1}", respectively, and a real part and an imaginary part of the first correction value B1_R after the first phase correction are denoted by "Re{B1_R}" and "Im{B1_R}", respectively, a rotation transform by the first phase correction is represented by the following equation:

$$\begin{pmatrix} \mathrm{Re}\{B1\_R\} \\ \mathrm{Im}\{B1\_R\} \end{pmatrix} = \overbrace{\begin{pmatrix} \mathrm{COS}(\theta 1) & \mathrm{SIN}(\theta 1) \\ -\mathrm{SIN}(\theta 1) & \mathrm{COS}(\theta 1) \end{pmatrix}}^{A1} \begin{pmatrix} \mathrm{Re}\{B1\} \\ \mathrm{Im}\{B1\} \end{pmatrix} \quad (9)$$

"A1" in Equation (9) indicates a matrix of the rotation transform of the first phase correction. The correction unit 26 obtains elements of the matrix A1, that is, "COS(θ1)" and "SIN(θ1)". "COS(θ1)" and "SIN(θ1)" are represented by the following equations, respectively:

$$\mathrm{COS}(\theta 1) = \frac{\mathrm{Re}\{B1\}}{\sqrt{\mathrm{Re}\{B1\}^2 + \mathrm{Im}\{B1\}^2}} \quad (10\text{-}1)$$

$$\mathrm{SIN}(\theta 1) = \frac{\mathrm{Im}\{B1\}}{\sqrt{\mathrm{Re}\{B1\}^2 + \mathrm{Im}\{B1\}^2}} \quad (10\text{-}2)$$

The correction unit 26 obtains a first correction value B1_R by applying a first phase transform to the first correction value B1 (ST255). A real part of the first correction value B1_R, that is, Re{B1_R}, is represented by the following equation:

$$\mathrm{Re}\{B1\_R\} = \mathrm{COS}(\theta 1)\mathrm{Re}\{B1\} + \mathrm{SIN}(\theta 1) \cdot \mathrm{Im}\{B1\} \quad (11)$$

Returning to FIG. 5. The capacitance detection device 2 determines whether it is a timing to shift to the correction mode (ST105). For example, the capacitance detection device 2 determines that it is the timing to shift to the correction mode at a predetermined cycle. The capacitance detection device 2 may also determine that it is the timing to shift to the correction mode when an instruction for performing a shift to the correction mode is input from the processing unit 3. When it is determined in step ST105 that it is the timing for the shift and the correction mode is entered (step ST110), the capacitance detection device 2 executes a process of FIG. 7.

Figure 7:
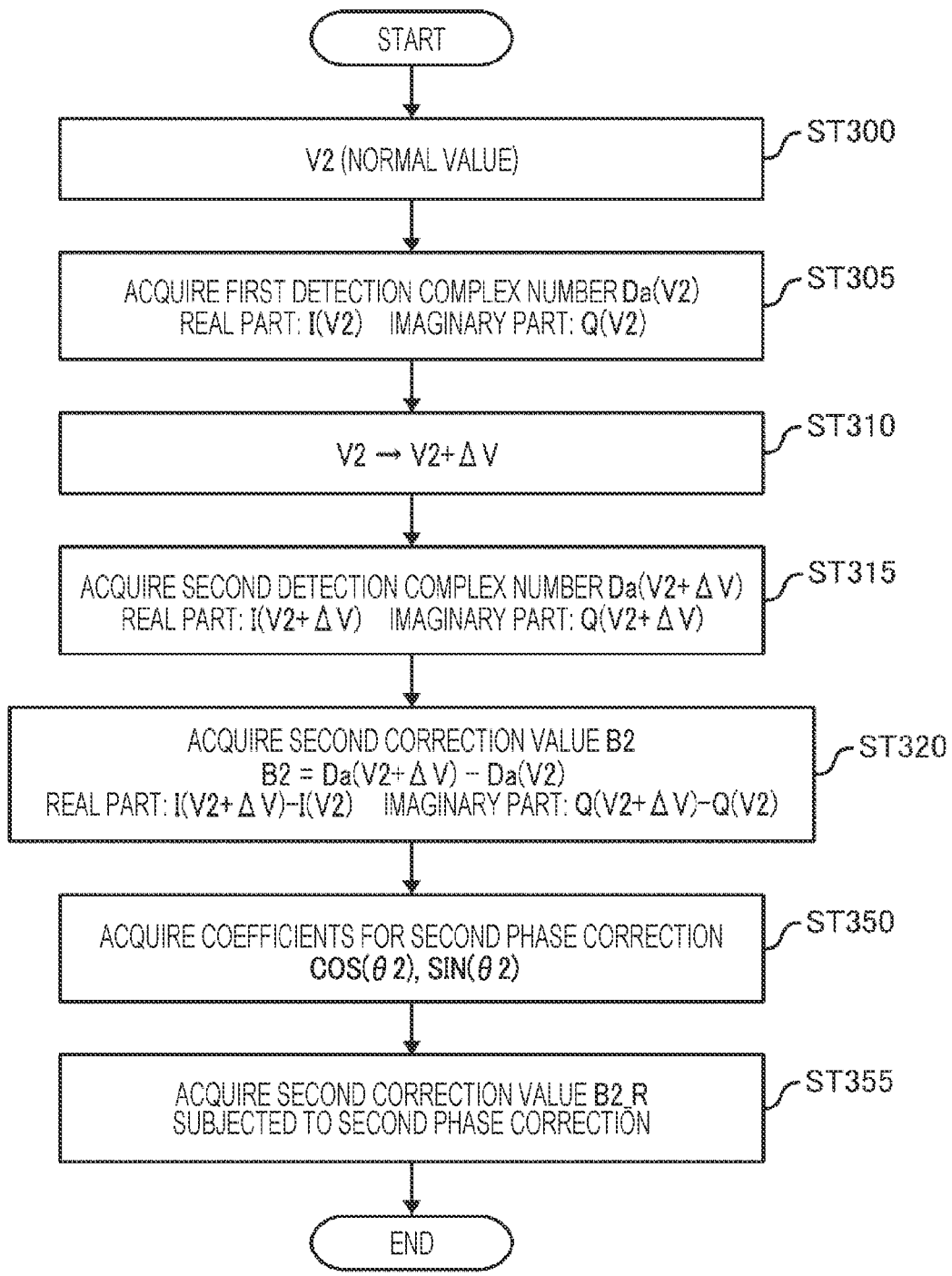
FIG. 7 is a flowchart of an example of a process in the correction mode after the initial state in the capacitance detection method of FIG. 5.

FIG. 7 is a flowchart of an example of a process in the correction mode (ST110) in the initial state in the capacitance detection method illustrated in FIG. 5.

First, the correction unit 26 controls the AC voltage output unit 20 (the second voltage output unit 22) so that the amplitude of the second AC voltage V2 becomes a normal value "V2" (ST300). That is, the correction unit 26 controls the AC voltage output unit 20 so that the AC voltage amplitude difference becomes a first amplitude difference "V1–V2".

The calculation unit 25 obtains the detection complex number Da as "a first detection complex number Da(V2)" when the second AC voltage V2 is of the normal amplitude "V2" (when the AC voltage amplitude difference is the first amplitude difference "V1–V2") in the correction mode after the initial state (ST305). A real part of the first detection complex number Da(V2) is "I(V2)" and an imaginary part of the first detection complex number Da(V2) is "Q(V2)".

Next, the correction unit 26 controls the AC voltage output unit 20 (the second voltage output unit 22) so that the amplitude of the second AC voltage V2 becomes higher than the normal value by "ΔV" (ST 310). The AC voltage amplitude difference is "V1−(V2+ΔV)". That is, the correction unit 26 controls the AC voltage output unit 20 so that the AC voltage amplitude difference becomes a second amplitude difference "V1−(V2+ΔV)".

The calculation unit 25 obtains the detection complex number Da as "a second detection complex number Da(V2+ ΔV)" when the amplitude of the second AC voltage V2 is "V2+ΔV" (when the AC voltage amplitude difference is the second amplitude difference "V1−(V2+ΔV)") in the correction mode after the initial state (ST315). A real part of the second detection complex number Da(V2+ΔV) is "I(V2+ ΔV)" and an imaginary part of the second detection complex number Da(V2+ΔV) is "Q(V2+ΔV)".

In the correction mode after the initial state, the correction unit 26 obtains a second correction value B2 in accordance with a change in the detection complex number Da caused by a change in the AC voltage amplitude difference ΔV (ST320). The correction unit 26 obtains a complex number as the second correction value B2 by subtracting the first detection complex number Da(V2) from the second detection complex number Da(V2+ΔV).

The correction unit 26 obtains a coefficient to be used for a second phase correction for correcting a phase so that the argument θ2 of the second correction value B2 approaches zero (ST 350). The second phase correction is a rotation transform that rotates a phase angle by "−θ2". Assuming that a real part and an imaginary part of the second correction value B2 before the second phase correction is performed are denoted by "Re{B2}" and "Im{B2}", respectively, and a real part and an imaginary part of the second correction value B2_R after the second phase correction are denoted by "Re{B2 R}" and "Im{B2 R}", respectively, a rotation transform by the second phase correction is represented by the following equation:

$$\begin{pmatrix} \text{Re}\{B2\_R\} \\ \text{Im}\{B2\_R\} \end{pmatrix} = \overbrace{\begin{pmatrix} \cos(\theta 2) & \sin(\theta 2) \\ -\sin(\theta 2) & \cos(\theta 2) \end{pmatrix}}^{A2} \begin{pmatrix} \text{Re}\{B2\} \\ \text{Im}\{B2\} \end{pmatrix} \quad (12)$$

"A2" in Equation (12) indicates a matrix of the rotation transform of the second phase correction.

The correction unit 26 obtains elements of the matrix A2, that is, "COS(θ2)" and "SIN(θ2)". "COS(θ2)" and "SIN (θ2)" are represented by the following equations, respectively:

$$\cos(\theta 2) = \frac{\text{Re}\{B2\}}{\sqrt{\text{Re}\{B2\}^2 + \text{Im}\{B2\}^2}} \quad (13-1)$$

$$\sin(\theta 2) = \frac{\text{Im}\{B2\}}{\sqrt{\text{Re}\{B2\}^2 + \text{Im}\{B2\}^2}} \quad (13-2)$$

The correction unit 26 obtains a second correction value B2 R by performing a second phase transform on the second correction value B2 (ST355). A real part of the second correction value B2_R, that is, Re{B2 R}, is represented by the following equation:

$$\text{Re}\{B2\_R\}=\cos(\theta 2)\cdot\text{Re}\{B2\}+\sin(\theta 2)\cdot\text{Im}\{B1\} \quad (14)$$

Returning to FIG. 5. The capacitance detection device 2 determines whether it is a timing to detect a capacitance (ST115). For example, the capacitance detection device 2 determines that it is the timing to detect a capacitance at a predetermined cycle. The timing of a shift to the correction mode determined in step ST105 is set so that the cycle is longer than the timing of a detection of a capacitance determined in step ST115. Accordingly, it is easier to reduce a processing load because a frequency of a shift to the correction mode (ST110) is less than a frequency of a detection of the capacitance.

When it is determined in step ST115 that it is the timing to detect a capacitance, the calculation unit 25 sets the second AC voltage V2 to have the normal amplitude "V2" (the AC voltage amplitude difference is set to the first amplitude difference "V1−V2") and obtains the detection complex number Da(V2) based on the detection signal Dm generated in this state (ST120). The correction unit 26 obtains a corrected detection value Ds based on the obtained detection complex number Da(V2), the first correction value B1_R (ST255, FIG. 6) subjected to the first phase correction, and the second correction value B2_R (ST355, FIG. 7) obtained in the most recent correction mode (ST125).

Figure 8:
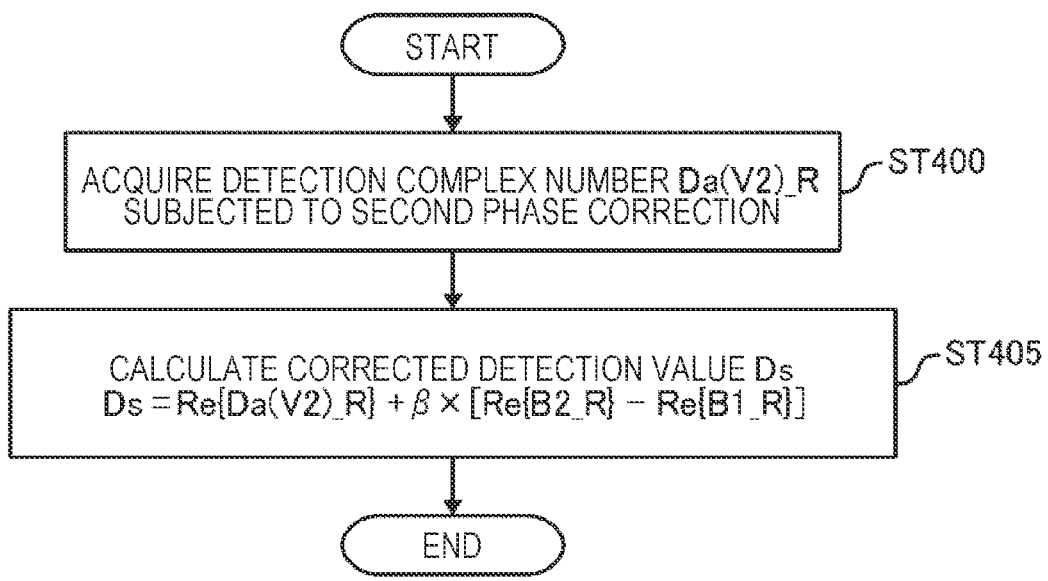
FIG. 8 is a flowchart of an example of a process of obtaining a corrected detection value in the capacitance detection method of FIG. 5.

FIG. 8 is a flowchart of an example of a process of obtaining a corrected detection value in the capacitance detection method of FIG. 5 (ST125).

The correction unit 26 performs the second phase correction on the detection complex number Da(V2) based on the coefficients "COS(θ2)" and "SIN(θ2)" (ST350, FIG. 7) for the second phase correction obtained by the second correction value B2 in the most recent correction mode (ST400). A real part of the detection complex number Da_R(V2) subjected to the second phase correction is represented by the following equation:

$$\text{Re}\{Da\_R(V2)\}=\cos(\theta 2)\cdot\text{Re}\{Da(V2)\}+\sin(\theta 2)\cdot\text{Im}\{Da(V2)\} \quad (15)$$

The correction unit 26 multiplies a difference between a real part "Re{B1_R}" of the first correction value B1_R subjected to the first phase correction and a real part "Re{B2 R}" of the second correction value B2R subjected to the second phase correction by a proportionality factor β. Based on a sum of a result of the multiplication and a real part "Re{Da_R(V2)}" of the detection complex number Da_R (V2) subjected to the second phase correction, a corrected detection value Ds is obtained. The corrected detection value Ds is represented by the following equation:

$$Ds=\text{Re}\{Da\_R(V2)\}+\times[\text{Re}\{B2\_R\}-\text{Re}\{B1\_R\}] \quad (16)$$

The capacitance detection device 2 repeats the process in step ST105 to step ST125 described above until the capacitance detection device 2 receives a termination instruction from the processing unit 3 (ST135). When receiving an instruction from the processing unit 3 to return to the initial state, the capacitance detection device 2 returns to step ST100 and repeats the process from step ST100 onward.

As described above, according to this embodiment, when the shift to the correction mode is repeatedly performed and the correction mode is entered, the AC voltage output unit 20 is controlled so that the difference between the amplitudes of the first AC voltage V1 and the second AC voltage V2 (the AC voltage amplitude difference) changes, and in addition, the correction values (B1 and B2) are obtained in accordance with the change in the detection value of the calculation unit 25 caused by the change in the AC voltage amplitude difference. Since the change in the detection value of the calculation unit 25 caused by the change in the AC voltage amplitude difference has a value corresponding to the shield capacitance Crs (Equations (2) and (3)), the correction values (B1 and B2) obtained in the correction mode have values corresponding to the shield capacitance Crs. The detection value is corrected in accordance with the change in the correction value (B2−B1), and accordingly, the detection value of the calculation unit 25 is corrected in accordance with the change in the shield capacitance Crs. Therefore, the change in the detection value of the calculation unit 25 caused by the change in the shield capacitance Crs may be corrected, thereby reducing a capacitance detection error.

Furthermore, according to this embodiment, the argument of the first correction value B1 obtained in the correction mode in the initial state, the argument of the second correction value B2 obtained in the correction mode after the initial state, and the argument of the detection complex number Da(V2) all become around zero by correcting the phases, and therefore, the real parts of these complex numbers (Equations (11), (14), and (15)) from which the effects of the jitter in the clock signal CK is almost removed are obtained.

Then the correction unit 26 obtains the detection value Ds subjected to the correction on the change in the shield capacitance Crs based on the real parts of the first correction value B1_R, the second correction value B2_R, and the detection complex number Da_R(V2) from which the effects of the jitter of the clock signal CK is removed. Specifically, since the correction target component, which is proportional to the difference between the real part of the first correction value B1_R subjected to the first phase correction and the real part of the second correction value B2_R subjected to the second phase correction, has a value corresponding to the change in the detection value caused by the change in the shield capacitance Crs (Equation (6)), the correction is performed on the real part of the detection complex number Da_R(V2) subjected to the second phase correction so that the correction target component is canceled out (Equation (16)). As for the detection value Ds obtained in this way, an error caused by the change in the shield capacitance Crs from the initial state and an error caused by the jitter of the clock signal CK are individually corrected, and therefore, the capacitance detection error may be further reduced.

Next, several modifications of the capacitance detection method according to this embodiment will be described.

<First Modification>

Figure 9:
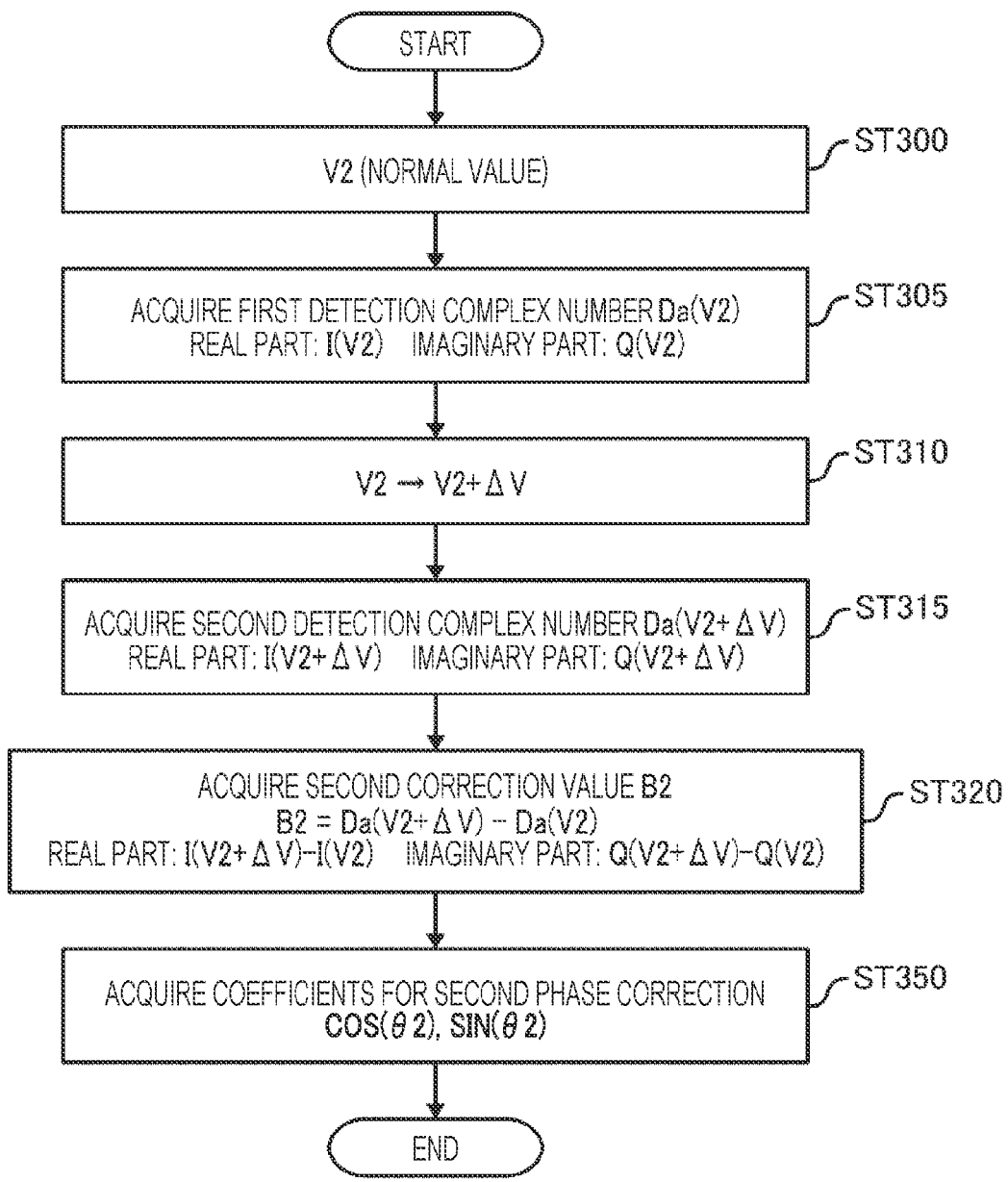
FIG. 9 is a flowchart of a modification of the process in the correction mode after the initial state in the capacitance detection method of FIG. 5.

FIG. 9 is a flowchart to explain a modification of the process in the correction mode (ST110) after the initial state in the capacitance detection method illustrated in FIG. 5.

In the first modification, the second phase correction for the second correction value B2 (Equation (14)) and the second phase correction for the detection complex number Da(V2) (Equation (15)) are equivalently replaced by a second phase correction to an intermediate correction value M (Equation (17)) based on the second correction value B2 and the detection complex number Da(V2). Therefore, the second phase correction process (ST355) on the second correction value B in the flowchart illustrated in FIG. 7 is omitted in the flowchart illustrated in FIG. 9. Other processes in the flowchart in FIG. 9 are the same as those in the flowchart in FIG. 7.

Figure 10:
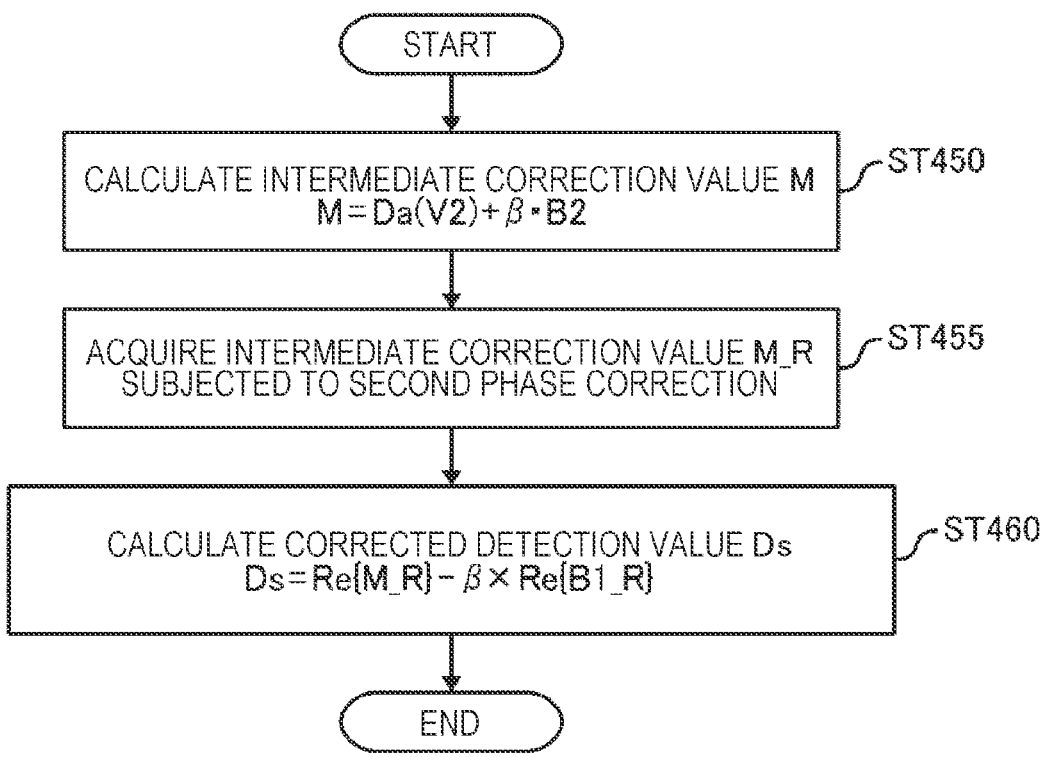
FIG. 10 is a flowchart of a modification of the process of obtaining a corrected detection value in the capacitance detection method of FIG. 5.

FIG. 10 is a flowchart of a modification of the process of obtaining a corrected detection value (ST125, FIG. 5).

In the process of obtaining the corrected detection value Ds (ST125, FIG. 5), the correction unit 26 first calculates an intermediate correction value M (ST450). The intermediate correction value M is represented by the following equation:

$$M = Da(V2) + \beta \cdot B2 \tag{17}$$

In Equation (17), the detection complex number Da(V2) is obtained in step ST120 (FIG. 5), and the second correction value B2 is obtained in step ST320 (FIG. 9).

The correction unit 26 performs the second phase correction based on the coefficients "COS(θ2)" and "SIN(θ2)" obtained in step ST350 (FIG. 9) on the calculated intermediate correction value M (ST455). In other words, the correction unit 26 performs the second phase correction on a sum of the complex number obtained by multiplying the second correction value B2 by the proportionality factor β and the detection complex number Da(V2) by rotating a phase angle corresponding to the argument θ2 of the second correction value. The real part of the intermediate correction value M_R subjected to the second phase correction is represented by the following equation:

$$\begin{aligned}\text{Re}\{M\_R\} &= \cos(\theta 2) \cdot \text{Re}\{M\} + \sin(\theta 2) \cdot \text{Im}\{M\} \\ &= \cos(\theta 2) \cdot \text{Re}\{Da(V2)\} + \sin(\theta 2) \cdot \text{Im}\{Da(V2)\} + \\ &\quad \beta[\cos(\theta 2) \cdot \text{Re}\{B2\} + \sin(\theta 2) \cdot \text{Im}\{B2\}] \\ &= \text{Re}\{Da\_R(V2)\} + \beta \cdot \text{Re}\{B2\_R\}\end{aligned} \tag{18}$$

The correction unit 26 obtains a corrected detection value Ds based on a result of subtraction of a value obtained by multiplying the real part of the first correction value B1_R subjected to the first phase correction (ST255, FIG. 6) by the proportionality factor f3 from the real part of the intermediate correction value M_R subjected to the second phase correction (ST455) (ST460). The detection value Ds obtained by this calculation is represented by the following equation:

$$\begin{aligned}\text{Re}\{M\_R\} - \beta \times RE\{B1\_R\} &= \text{Re}\{Da\_R(V2)\} + \beta \cdot \\ &\quad \text{Re}\{B2\_R\} - \beta \times \text{Re}\{B1\_R\} \\ &= \text{Re}\{Da\_R(V2)\} + \beta \times \\ &\quad [\text{Re}\{B2\_R\} - \text{Re}\{B1\_R\}]\end{aligned} \tag{19}$$

As can be seen from Equation (19), the detection value Ds calculated using the intermediate correction value M is equivalent to the detection value Ds calculated in accordance with Equation (16).

<Second Modification>

In a second modification, when the correction values (the first correction value B1 and the second correction value B2) of the complex numbers according to the change in the detection complex number Da caused by the change in the AC voltage amplitude difference (V1−V2) are obtained, the AC voltage amplitude difference (V1−V2) is modulated by a modulation signal.

Figure 11:
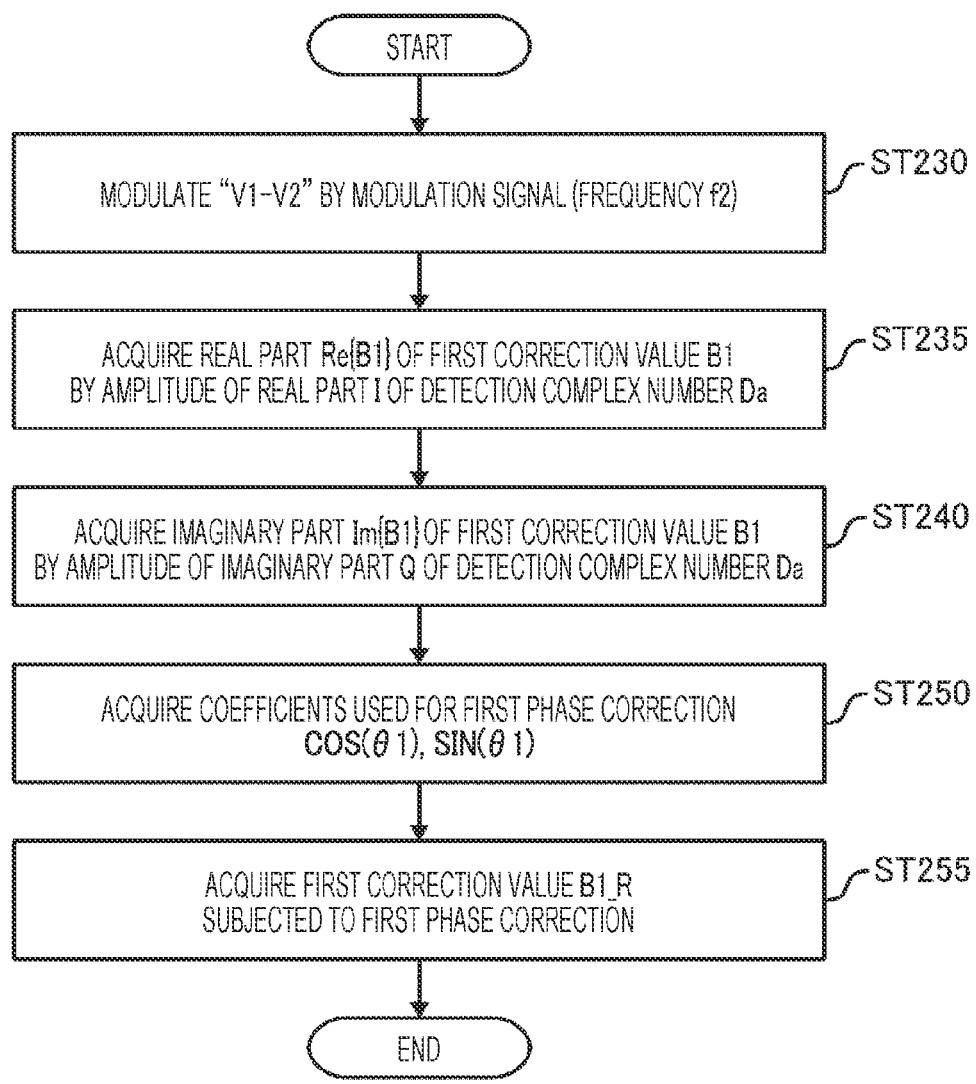
FIG. 11 is a flowchart of a modification of the process in the correction mode in the initial state in the capacitance detection method of FIG. 5.

FIG. 11 is a flowchart of a modification of the process in the correction mode in the initial state (ST100, FIG. 5) in the capacitance detection method of FIG. 5.

When the correction mode is entered, the correction unit 26 controls the AC voltage output unit 20 so that the AC voltage amplitude difference (V1−V2) is modulated by a constant amplitude modulation signal having the frequency f2 (f2<f1). For example, the correction unit 26 causes the sine-wave signal generation unit 211 (FIG. 2) to generate a sine-wave signal of the frequency f1 having an amplitude modulated by the modulation signal of the frequency f2, thereby causing the first voltage output unit 21 to output the first AC voltage V1 modulated by the modulation signal of the frequency f2. Since the second AC voltage V2 output from the second voltage output unit 22 is obtained by attenuating the amplitude of the first AC voltage V1, a degree of the modulation of the second AC voltage V2 is the same as that of the first AC voltage V1. Therefore, the AC voltage amplitude difference (V1−V2) is the AC voltage of the frequency f1 modulated by the modulation signal of the frequency f2.

When the AC voltage amplitude difference (V1−V2) is modulated as described above, the real part (the first demodulation signal I) and the imaginary part (the second demodulation signal Q) of the detection complex number Da output from the calculation unit 25 include respective AC components of the frequency f2 caused by the modulation signal. The correction unit 26 detects an amplitude of the AC component of the frequency f2 included in the real part of the detection complex number Da, and obtains the detected amplitude as the real part "Re{B1}" of the first correction value B1 (ST235). Furthermore, the correction unit 26 detects the amplitude of the AC component of the frequency f2 included in the imaginary part of the detection complex number Da, and obtains the detected amplitude as the imaginary part "Im{B1}" of the first correction value B1 (ST 240). The amplitude of the AC component may be detected, for example, by a process of detecting upper and lower peak values of the AC component and averaging a difference between the upper and lower peak values. After individually obtaining the real part and the imaginary part of the first correction value B1, the correction unit 26 obtains the real part of the first correction value B1_R subjected to the first phase correction by the same process as the process in step ST250 and ST255 in the flowchart of FIG. 6.

Figure 12:
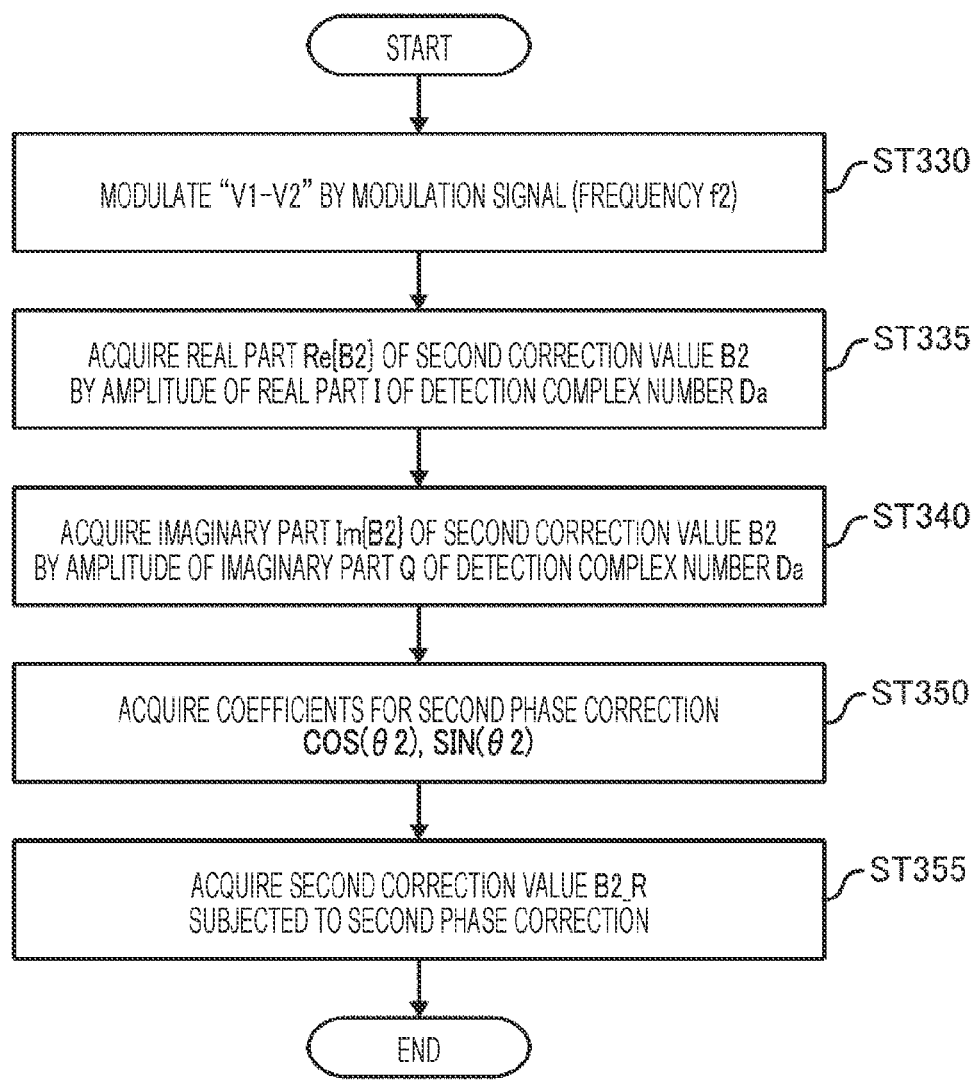
FIG. 12 is a flowchart of a modification of the process in the correction mode after the initial state in the capacitance detection method of FIG. 5.

FIG. 12 is a flowchart illustrating a modification of the process in the correction mode after the initial state (ST110, FIG. 5) in the capacitance detection method illustrated in FIG. 5.

Also in this case, the correction unit 26 modulates the AC voltage amplitude difference (V1−V2) by a modulation signal of the frequency f2 having a constant amplitude (ST330). With the AC voltage amplitude difference (V1−V2) modulated, the correction unit 26 detects an amplitude of the AC component of the frequency f2 included in the real part of the detection complex number Da, and obtains the detected amplitude as the real part "Re{B2}" of the second correction value B2 (ST335). The correction unit 26 detects the amplitude of the AC component of the frequency f2 included in the imaginary part of the detection complex number Da, and obtains the detected amplitude as the imaginary part "Im{B2}" of the second correction value B2 (ST340). Then the correction unit 26 obtains the coefficients "COS(θ2)" and "SIN(θ2)" for the second phase correction and the real part of the second correction value B2_R subjected to the second phase correction by the same process as the process in step ST350 and step ST355 in the flowchart of FIG. 7.

Also in the capacitance detection method according to the second modification, the correction values (the first correction value B1 and the second correction value B2) of the complex numbers in accordance with the change in the detection complex number Da caused by the change in the AC voltage amplitude difference (V1−V2) may be obtained, and therefore, as in the embodiment described above, a corrected detection value Ds may be obtained.

Second Embodiment

Next, a capacitance detection device and a capacitance detection method for the capacitance detection device according to the second embodiment will be described. In the first embodiment described above, the correction of the error caused by the change in the shield capacitance Crs and the correction of the error in the detection value caused by the jitter of the clock signal CK are individually performed, but in the second embodiment, only a correction of an error in a detection value caused by a change in a shield capacitance Crs is performed. In the second embodiment, only a real part of a detection complex number Da (a first demodulation signal I) is used for processing, since a process relating to a phase correction is not performed. Therefore, a calculation unit 25 of a capacitance detection device 2 of the second embodiment is not required to include sections involved in generation of a second demodulation signal Q (a second demodulation unit 254 and a second synchronization signal generation unit 258). Other components of the capacitance detection device 2 according to the second embodiment may be substantially the same as those illustrated in FIGS. 1 to 4.

Figure 13:
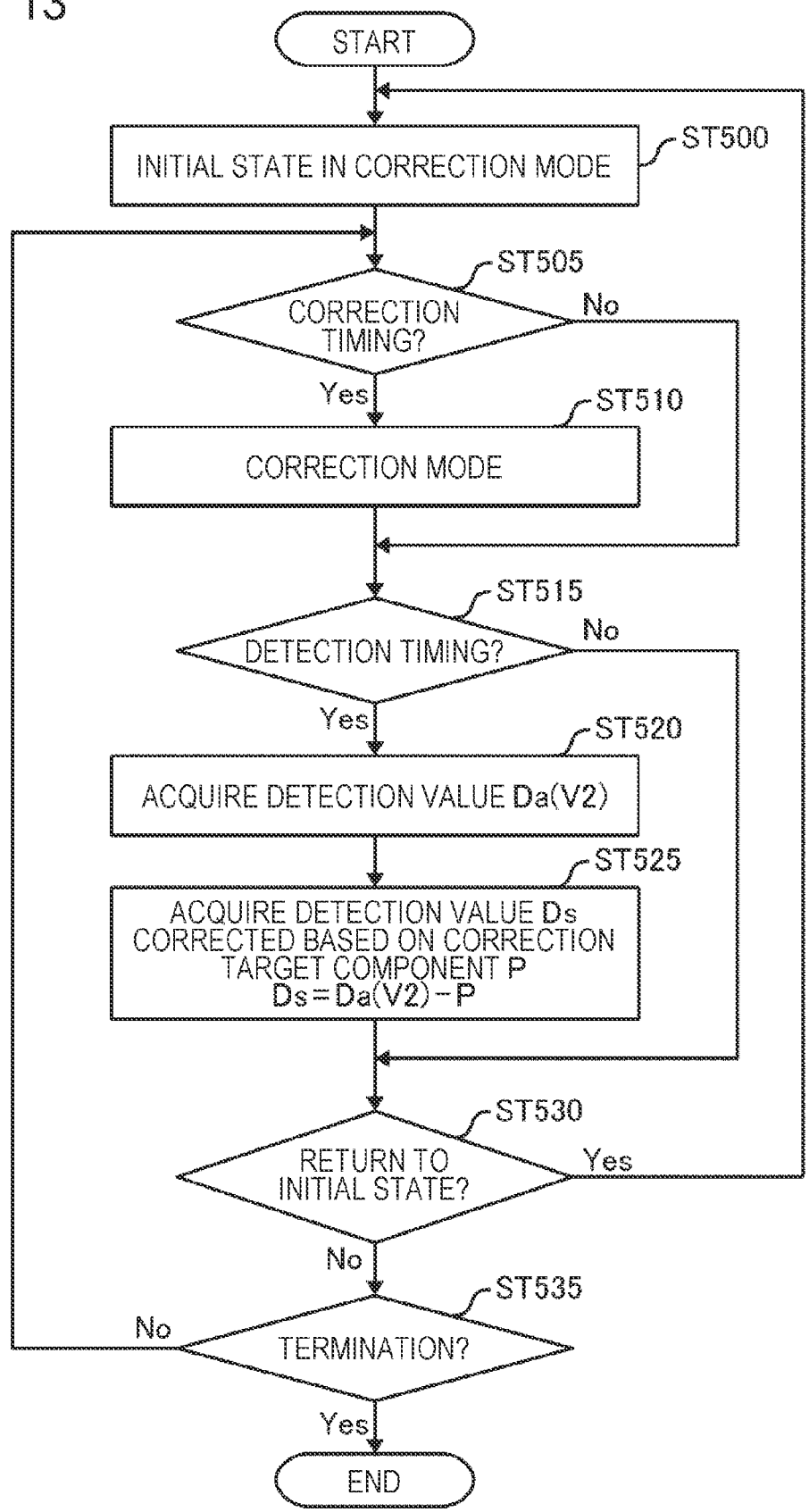
FIG. 13 is a flowchart of an example of a capacitance detection method according to a second embodiment.

FIG. 13 is a flowchart of an example of the capacitance detection method according to the second embodiment. For example, at startup when the power supply is turned on or when an instruction for setting an initial state is input from the processing unit 3, the capacitance detection device 2 enters a correction mode in an initial state (ST500).

Figure 14:
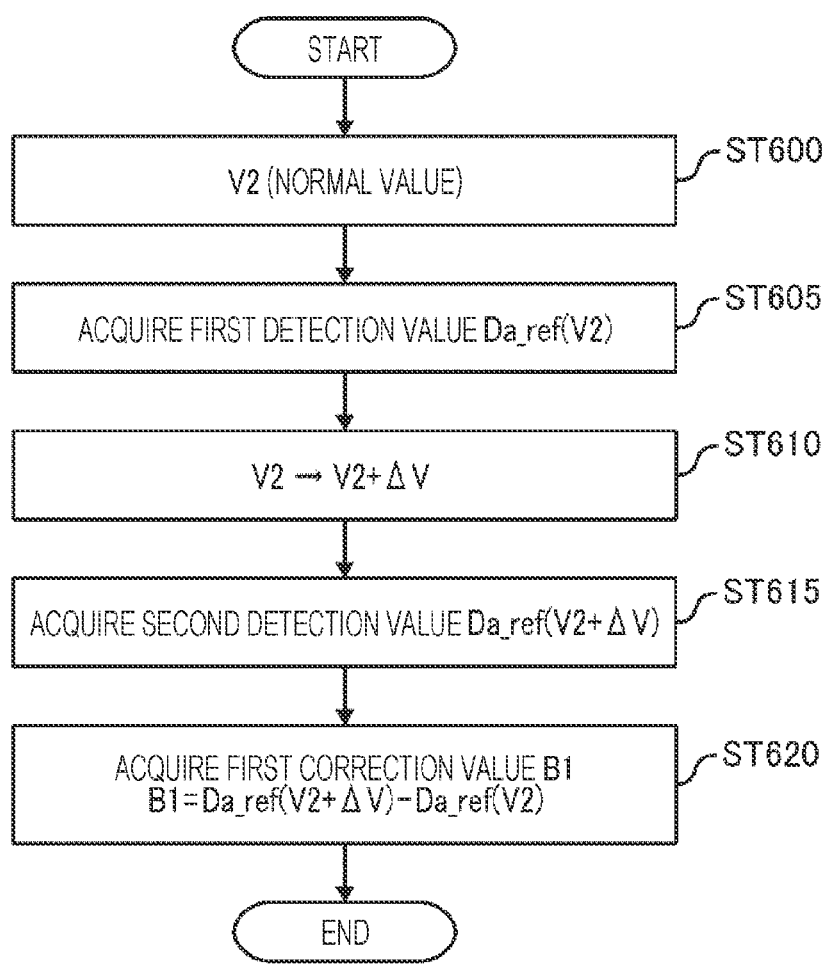
FIG. 14 is a flowchart of an example of a process in a correction mode in an initial state in the capacitance detection method of FIG. 13.

FIG. 14 is a flowchart of an example of a process in the correction mode (ST500) in the initial state in the capacitance detection method illustrated in FIG. 13.

First, a correction unit 26 controls an AC voltage output unit 20 (a second voltage output unit 22) so that an amplitude of a second AC voltage V2 has a normal amplitude "V2" (ST600). That is, the correction unit 26 controls the AC voltage output unit 20 so that an AC voltage amplitude difference becomes a first amplitude difference "V1−V2".

The calculation unit 25 obtains a detection value (a first demodulation signal I) as "a first detection value Da_ref (V2)" when the second AC voltage V2 is of a normal amplitude "V2" (when an AC voltage amplitude difference is the first amplitude difference "V1−V2") in the correction mode in the initial state (ST605).

Next, the correction unit 26 controls the AC voltage output unit 20 (the second voltage output unit 22) so that the amplitude of the second AC voltage V2 is higher than the normal value by "ΔV" (ST 610). That is, the correction unit 26 controls the AC voltage output unit 20 so that the AC voltage amplitude difference becomes a second amplitude difference "V1−(V2+ΔV)".

The calculation unit 25 obtains a detection value (the first demodulation signal I) as "a second detection value Da_ref (V2+ΔV)" when an amplitude of the second AC voltage V2 is "V2+ΔV" (when the AC voltage amplitude difference is the second amplitude difference "V1−V2+ΔV") in the correction mode in the initial state (ST215).

In the initial state of the correction mode, the correction unit 26 obtains a first correction value B1 in accordance with a change in the detection value (the first demodulation signal I) caused by a change in the AC voltage amplitude difference ΔV (ST620). The correction unit 26 obtains a value obtained by subtracting the first detection value Da_ref(V2) from the second detection value Da_ref(V2+ΔV) as the first correction value B1.

Returning to FIG. 13. The capacitance detection device 2 determines whether it is a timing to shift to the correction mode (ST505). For example, the capacitance detection device 2 determines that it is the timing to shift to the correction mode at a predetermined cycle. The capacitance detection device 2 may also determine that it is the timing to shift to the correction mode when an instruction for performing a shift to the correction mode is input from the processing unit 3. When it is determined in step ST505 that it is the timing for the shift and the correction mode is entered (step ST510), the capacitance detection device 2 executes a process in FIG. 15.

FIG. 15 is a flowchart of an example of a process in the correction mode (ST510) after the initial state in the capacitance detection method illustrated in FIG. 13.

First, the correction unit 26 controls the AC voltage output unit 20 (the second voltage output unit 22) so that the amplitude of the second AC voltage V2 becomes a normal value "V2" (ST700). That is, the correction unit 26 controls the AC voltage output unit 20 so that the AC voltage amplitude difference becomes a first amplitude difference "V1−V2".

The calculation unit 25 obtains a detection value (a first demodulation signal I) as "a first detection value Da (V2)" when the second AC voltage V2 is of the normal amplitude "V2" (when the AC voltage amplitude difference is the first amplitude difference "V1−V2") in the correction mode after the initial state (ST705).

Next, the correction unit 26 controls the AC voltage output unit 20 (the second voltage output unit 22) so that the amplitude of the second AC voltage V2 is higher than the normal value by "ΔV" (ST 710). The AC voltage amplitude difference is "V1−(V2+ΔV)". That is, the correction unit 26 controls the AC voltage output unit 20 so that the AC voltage amplitude difference becomes a second amplitude difference "V1−(V2+ΔV)".

The calculation unit 25 obtains a detection value (the first demodulation signal I) as "a second detection value Da (V2+ΔV)" when an amplitude of the second AC voltage V2 is "V2+ΔV" (when the AC voltage amplitude difference is the second amplitude difference "V1−V2+ΔV") in the correction mode after the initial state (ST715).

In the correction mode after the initial state, the correction unit 26 obtains a second correction value B2 in accordance with a change in the detection value (the first demodulation signal I) caused by a change in the AC voltage amplitude difference ΔV (ST720). The correction unit 26 obtains a value obtained by subtracting the first detection value Da (V2) from the second detection value Da (V2+ΔV) as the second correction value B2.

The correction unit 26 calculates a correction target component P=−β·(B2−B1), which is proportional to a difference between the first correction value B1 (ST620, FIG. 14) obtained in the correction mode in the initial state and the second correction value B2 (ST720) obtained in the correction mode after the initial state (ST750). A correction target component P corresponds to "ΔVo_crs" in Equation (6), and has a value corresponding to a change in the detection value (the first demodulation signal I) due to the change in the shield capacitance Crs.

Returning to FIG. 13. The capacitance detection device 2 determines whether it is a timing to detect a capacitance (ST515). For example, the capacitance detection device 2 determines that it is the timing to detect a capacitance at a predetermined cycle. A timing of a shift to the correction mode determined in step ST505 is set so that the cycle is longer than the timing of a detection of the capacitance determined in step ST515. Accordingly, it is easier to reduce a processing load because a frequency of a shift to the correction mode (ST510) is less than a frequency of a detection of the capacitance.

When it is determined in step ST515 that it is the timing to detect a capacitance, the calculation unit 25 sets the second AC voltage V2 to have the normal amplitude "V2" (the AC voltage amplitude difference is set to the first amplitude difference "V1−V2") and obtains the detection value Da(V2) based on the detection signal Dm generated in this state (ST520). The correction unit 26 corrects the acquired detection value Da(V2) based on the correction target component P calculated in step ST750 (FIG. 15). In other words, the correction unit 26 subtracts the correction target component P from the detection value Da(V2) (Da (V2)−P) so that the correction target component P according to the change in the detection value (the first demodulation signal I) caused by the change in the shield capacitance Crs is canceled out, and obtains a result of the subtraction as a corrected detection value Ds (ST525).

The capacitance detection device 2 repeats the process in step ST505 to step ST525 described above until the capacitance detection device 2 receives a termination instruction from the processing unit 3 (ST535). When receiving an instruction from processing unit 3 to return to the initial state, the capacitance detection device 2 returns to step ST500 and repeats the process from step ST500 onward.

As described above, also in this embodiment, as in the foregoing first embodiment, an error of the detection value caused by the change in the shield capacitance Crs may be effectively reduced.

Note that, also in the second embodiment, as in the second modification of the first embodiment described above, the correction values (the first correction value B1 and the second correction value B2) may be obtained with the AC voltage amplitude difference modulated in the correction mode.

Figure 16A:
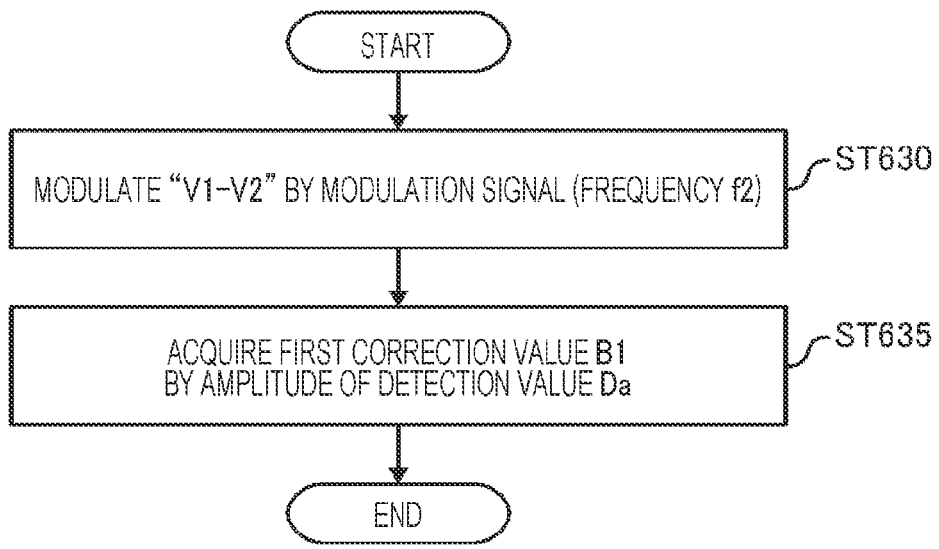
FIGS. 16A and 16B are a flowchart of a modification of the process in the correction mode in the capacitance detection method of FIG. 13.

FIG. 16A is a flowchart of a modification of the process in the correction mode in the initial state (ST500) in the capacitance detection method of FIG. 13. When the correction mode is entered in the initial state, the correction unit 26 controls the AC voltage output unit 20 so that the AC voltage amplitude difference (V1−V2) is modulated by a modulation signal of the frequency f2 (f2<f1) with a constant amplitude (ST630), also detects an amplitude of an AC component of the frequency f2 included in the detection value (the first demodulation signal I), and obtains the detected amplitude as a first correction value B1 (ST635).

Figure 16B:
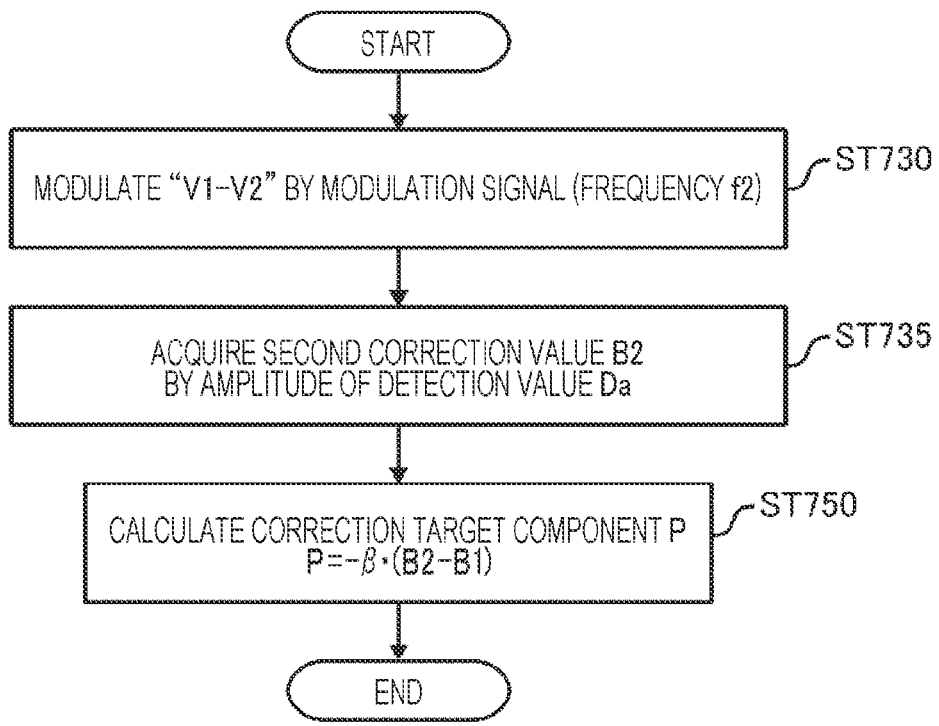

FIG. 16B is a flowchart of a modification of the process in correction mode after the initial state (ST510) in the capacitance detection method illustrated in FIG. 13. When the correction mode after the initial state is entered, the correction unit 26 controls the AC voltage output unit 20 so that the AC voltage amplitude difference (V1−V2) is modulated by a modulation signal of the frequency f2 (f2<f1) with a constant amplitude (ST730), also detects an amplitude of an AC component of the frequency f2 included in the detection value (the first demodulation signal I), and obtains the detected amplitude as a second correction value B2 (ST735).

Then, the correction unit 26 calculates a correction target component P=−β·(B2−B1) as in step ST750 of the flowchart in FIG. 15.

Also in the capacitance detection method according to this modification, the correction values (the first correction value B1 and the second correction value B2) in accordance with the change in the detection value (the first demodulation signal I) caused by the change in the AC voltage amplitude difference (V1−V2) may be obtained, and therefore, as in the embodiment described above, a corrected detection value Ds may be obtained.

Note that the present invention is not limited to the embodiments described above, and includes various modifications.

Although the example in which the amplitude of the second AC voltage V2 is changed while the amplitude of the first AC voltage V1 is maintained constant so that the AC voltage amplitude difference (V1−V2) is changed is described in the embodiments described above, as another example of this embodiment, the AC voltage amplitude difference (V1−V2) may be changed by changing the amplitude of the first AC voltage V1 while the amplitude of the second AC voltage V2 is maintained constant. Furthermore, according to yet another embodiment other than this embodiment, the AC voltage amplitude difference (V1−V2) may be changed by individually changing the amplitude of the first AC voltage V1 and the amplitude of the second AC voltage V2. In either case, since Equations (4) and (5) are satisfied when it is assumed that changes in capacitances of the capacitors Crg, Crgl, and Cag are sufficiently small and negligible compared to a change in the shield capacitance Crs due to temperature, etc., an error in the detection value caused by the change in the shield capacitance Crs may be corrected.

The input device according to this embodiment is not limited to a user interface device for inputting information by operation using a finger or the like. In other words, the input device according to the present invention is widely applicable to devices that input information in accordance with a capacitance of a detection electrode which changes in response to a proximity of various objects not limited to a human body.

What is claimed is:

1. A capacitance detection device for detecting a capacitance between a detection electrode and an object approaching the detection electrode, the capacitance detection device comprising:
   an AC voltage output unit configured to output a first AC voltage and a second AC voltage, the first AC voltage being supplied to a shield electrode disposed in a vicinity of the detection electrode, and the second AC voltage having a frequency and a phase which are substantially the same as that of the first AC voltage and having an amplitude smaller than that of the first AC voltage such that there is an amplitude difference between the first AC voltage and the second AC voltage;
   a detection signal generation unit having a first node connected to the detection electrode, configured to supply a charge to the detection electrode from the first node such that a voltage of the first node approaches the second AC voltage, and to generate an AC detection signal in accordance with the charge supplied to the detection electrode;
   a calculation unit configured to calculate a detection value of the capacitance based on the AC detection signal; and
   a correction unit configured to correct an error in the detection value due to a change in a shield capacitance which is a parasitic capacitance between the shield electrode and the detection electrode,
   wherein the correction unit is further configured to have a correction mode which is repeatedly performed, and in the correction mode, the correction unit controls the AC voltage output unit to change the amplitude difference between the first and second AC voltages, which causes a change in the detection value, and to obtain a correction value corresponding to the change in the detection value caused by a change in the difference, and
   wherein the correction unit corrects, in a normal mode, the detection value in accordance with a change in the correction value obtained in the correction mode.

2. The capacitance detection device according to claim 1, wherein the correction unit corrects the detection value by cancelling out a correction target component therein, the correction target component being proportional to a difference between a first correction value obtained in the correction mode in an initial state and a second correction value obtained in the correction mode after the initial state, and the correction target component corresponding to the error in the detection value due to the change in the shield capacitance.

3. The capacitance detection device according to claim 2, wherein the correction unit calculates the correction target component each time when the correction unit enters the correction mode, and in a normal operation mode, corrects the detection value based on the correction target component which is most recently calculated in the correction mode.

4. The capacitance detection device according to claim 1, further comprising:
   an analog-to-digital conversion unit configured to convert the AC detection signal into a digital detection signal in synchronization with a clock signal,
   wherein the AC voltage output unit outputs each of the first AC voltage and the second AC voltage as a sine wave having a first frequency, and
   wherein the calculation unit is further configured to multiply the digital detection signal and a sine-wave synchronization signal which has of the first frequency and is synchronized with the clock signal, and to calculate the detection value corresponding to a demodulation signal which is obtained by removing harmonic components from a result of the multiplication.

5. The capacitance detection device according to claim 4, wherein in the correction mode, the correction unit obtains the correction value in accordance with a difference between a first detection value and a second detection value, the first detection value being obtained when the AC voltage output unit is controlled to have a first amplitude difference between the first and second AC voltages, and the second detection value being obtained when the AC voltage output unit is controlled to have a second amplitude difference between the first and second AC voltages, the second amplitude difference being different from the first amplitude difference.

6. The capacitance detection device according to claim 4, wherein in the correction mode, the correction unit controls the AC voltage output unit such that the amplitude difference between the first and second AC voltages is modulated by a modulation signal having a constant amplitude and having a second frequency lower than the first frequency, and obtains the correction value in accordance with an amplitude of an AC component having the second frequency in the demodulation signal.

7. The capacitance detection device according to claim 1, further comprising:
   an analog-to-digital conversion unit configured to convert the AC detection signal into a digital detection signal in synchronization with a clock signal,
   wherein the AC voltage output unit outputs each of the first AC voltage and the second AC voltage as a sine wave having a first frequency, wherein the calculation unit is further configured to multiply the digital detection signal and a first synchronization signal synchronized with the clock signal and having the first frequency and a phase approximating that of the first AC voltage, thereby obtaining a first multiplication signal, to multiply the digital detection signal and a second synchronization signal synchronized with the clock signal and having the first frequency and a phase shifted by a quarter cycle relative to that of the first synchronization signal, thereby obtaining a second multiplication signal, and to obtain a detection complex number having a real part corresponding to a first demodulation signal obtained by removing harmonic components from the first multiplication signal and an imaginary part corresponding to a second demodulation signal obtained by removing harmonic components from the second multiplication signal, wherein the correction unit is further configured to repeatedly, by entering the correction mode, a correction complex number corresponding to a change in the detection complex number caused by the change in the amplitude difference between the first and second AC voltages, as the correction value, wherein the correction unit performs a first phase correction on a first correction complex number which is a first correction value obtained in the correction mode in an initial state, such that an argument of the first correction complex number approaches zero, thereby obtaining a phase-corrected first correction complex number, and performs a second phase correction on a second correction complex number which is a second correction value obtained in the correction mode after the initial state such that an argument of the second correction complex number approaches zero, thereby obtaining a phase-corrected second correction complex number, and further performs the second phase correction on the detection complex number, thereby obtaining a phase-corrected detection complex number, and wherein the correction unit corrects the detection value by correcting a real part of the phase-corrected detection complex number such that a correction target component of the detection value is canceled out, the correction target component being proportional to a difference between a real part of the phase-corrected first correction complex number and a real part of the phase-corrected second correction complex number and corresponding to an error in a real part of the detection complex number due to the change in the shield capacitance.

8. The capacitance detection device according to claim 7, wherein in the correction mode, the correction unit obtains the correction value in accordance with a difference between a first detection complex number and a second detection complex number, the first detection complex number being obtained when the AC voltage output unit is controlled to have a first amplitude difference, and the second detection complex number being obtained when the AC voltage output unit is controlled to have a second amplitude difference different from the first amplitude difference.

9. The capacitance detection device according to claim 7, wherein in the correction mode, the correction unit controls the AC voltage output unit such that the amplitude difference between the first and second AC voltages is modulated by a modulation signal having a constant amplitude and a second frequency lower than the first frequency, and obtains a real part of the correction value in accordance with an amplitude of an AC component having the second frequency in the first demodulation signal, and an imaginary part of the correction value in accordance with an amplitude of an AC component having the second frequency in the second demodulation signal.

10. The capacitance detection device according to claim 7, wherein the correction unit is further configure to multiply a difference between a real part of the phase corrected first correction complex number and a real part of the phase-corrected second correction complex number by a proportionality factor, and to obtain the detection value that was corrected based on a sum of a result of the multiplication and a real part of the phase-corrected detection complex number.

11. The capacitance detection device according to claim 7, wherein the correction unit performs the second phase correction on an intermediate correction complex number by rotating a phase angle thereof by an amount corresponding to the argument of the second correction complex number, thereby obtaining a phase-corrected intermediate correction complex number, the intermediate correction complex number corresponding to a sum of the detection complex number and a complex number which is obtained by multiplying the second correction complex number by a proportionality factor, and obtains the detection value that was corrected based on a result of a subtraction of a value obtained by multiplying the real part of the phase-corrected first correction complex number by the proportionality factor from a real part of the phase-corrected intermediate correction complex number.

12. The capacitance detection device according to claim 7, wherein the correction unit obtains the second correction complex number each time when the correction unit enters the correction mode, and in a normal operation mode, obtains the detection value that was corrected based on the phase-corrected first correction complex number, the second correction complex number most-recently obtained in the correction mode, and the detection complex number.

13. The capacitance detection device according to claim 1, wherein, when the object approaching the detection electrode does not exist in the normal operation mode, the AC voltage output unit outputs the second AC voltage having such an amplitude that the charge supplied from the node to the detection electrode approaches zero, or the second AC voltage having such an amplitude that an amplitude of the AC detection signal approaches zero.

14. A capacitance detection method executed by a capacitance detection device for detecting a capacitance between an detection electrode and an object approaching the detection electrode, the capacitance detection device including a first node connected to the detection electrode, the capacitance detection method comprising:
an AC voltage output step, including:
outputting a first AC voltage to be supplied to a shield electrode disposed in a vicinity of the detection electrode; and
outputting a second AC voltage having a frequency and a phase which are substantially the same as that of the first AC voltage, and having an amplitude smaller than that of the first AC voltage such that there is an amplitude difference between the first and second AC voltages;

a detection signal generation step, including:
   supplying a charge to the detection electrode from the node such that a voltage of the first node approaches the second AC voltage; and
   generating an AC detection signal in accordance with the charge supplied to the detection electrode;

a calculation step for calculating a detection value of the capacitance based on the AC detection signal; and a correction step for correcting an error in the detection value due to a change in a shield capacitance which is a parasitic capacitance between the shield electrode and the detection electrode, the correction step including;

repeatedly performing in a correction mode, each performing including:
      controlling the AC voltage output step so as to change the amplitude difference between the first and second AC voltages, which causes a change in the detection value, and
      obtaining a correction value corresponding to the change in the detection value; and
   correcting the detection value, in a normal mode, based on a change in the correction value obtained in the correction mode.

15. An input device comprising:
a detection electrode configured to form a capacitance between the detection electrode and an object, the capacitance changing in accordance with an approach of the object;
a shield electrode disposed in proximity to the detection electrode; and
the capacitance detection device according to claim 1 for detecting the capacitance between the object and the detection electrode.

* * * * *